(12) United States Patent
Moon et al.

(10) Patent No.: US 10,748,856 B2
(45) Date of Patent: Aug. 18, 2020

(54) FAN-OUT SEMICONDUCTOR PACKAGE

(71) Applicant: SAMSUNG ELECTRONICS CO., LTD., Suwon-si (KR)

(72) Inventors: Seon Hee Moon, Suwon-Si (KR); Myung Sam Kang, Suwon-Si (KR); Jin Gu Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/103,199

(22) Filed: Aug. 14, 2018

(65) Prior Publication Data
US 2019/0287924 A1 Sep. 19, 2019

(30) Foreign Application Priority Data
Mar. 13, 2018 (KR) .......................... 10-2018-0029383

(51) Int. Cl.
*H01L 23/00* (2006.01)
*H01L 23/538* (2006.01)
(Continued)

(52) U.S. Cl.
CPC .......... *H01L 23/562* (2013.01); *H01L 21/486* (2013.01); *H01L 21/4853* (2013.01);
(Continued)

(58) Field of Classification Search
CPC ............. H01L 21/4853; H01L 21/4857; H01L 21/486; H01L 21/565; H01L 2224/214;
(Continued)

(56) References Cited

U.S. PATENT DOCUMENTS

| 7,656,015 B2* | 2/2010 | Wong ................... H01L 23/3677 |
| | | 257/685 |
| 8,941,230 B2* | 1/2015 | Kyozuka ................. H01L 24/19 |
| | | 174/256 |

(Continued)

FOREIGN PATENT DOCUMENTS

| JP | 2012-047858 A | 3/2012 |
| JP | 2014-56925 A | 3/2014 |

(Continued)

OTHER PUBLICATIONS

Communication dated Mar. 25, 2019, issued by the Korean Intellectual Property Office in counterpart Korean Application No. 10-2018-0029383.

(Continued)

*Primary Examiner* — Mohammed Shamsuzzaman
(74) *Attorney, Agent, or Firm* — Sughrue Mion, PLLC

(57) ABSTRACT

A fan-out semiconductor package includes: a core member having a first through-hole and including a dummy metal layer; a first semiconductor chip disposed in the first through-hole and having a first active surface having first connection pads disposed thereon and a first inactive surface opposing the first active surface; a first encapsulant covering at least portions of the core member and the first semiconductor chip and filling at least portions of the first through-hole; and a first connection member disposed on the core member and the first active surface of the first semiconductor chip and including a first redistribution layer electrically connected to the first connection pads, wherein the dummy metal layer is electrically insulated from signal patterns of the first redistribution layer.

16 Claims, 15 Drawing Sheets

(51) Int. Cl.
*H01L 23/367* (2006.01)
*H01L 23/552* (2006.01)
*H01L 21/48* (2006.01)
*H01L 21/56* (2006.01)
*H01L 23/31* (2006.01)

(52) U.S. Cl.
CPC ........ *H01L 21/4857* (2013.01); *H01L 21/565* (2013.01); *H01L 23/3135* (2013.01); *H01L 23/367* (2013.01); *H01L 23/5383* (2013.01); *H01L 23/5384* (2013.01); *H01L 23/5386* (2013.01); *H01L 23/5389* (2013.01); *H01L 23/552* (2013.01); *H01L 24/19* (2013.01); *H01L 24/20* (2013.01); *H01L 2224/214* (2013.01); *H01L 2924/3511* (2013.01)

(58) Field of Classification Search
CPC ............... H01L 23/3135; H01L 23/367; H01L 23/5383; H01L 23/5384; H01L 23/5386; H01L 23/5389; H01L 23/552; H01L 23/562; H01L 24/19; H01L 24/20; H01L 2924/3511
See application file for complete search history.

(56) References Cited

U.S. PATENT DOCUMENTS

| | | | |
|---|---|---|---|
| 9,691,708 B1 | 6/2017 | Huang et al. | |
| 9,847,320 B2* | 12/2017 | Chen | H01L 25/0657 |
| 9,935,068 B2* | 4/2018 | Ban | H01L 23/5283 |
| 9,984,979 B2* | 5/2018 | Park | H01L 24/19 |
| 10,037,963 B2* | 7/2018 | Chen | H01L 24/24 |
| 10,043,772 B2* | 8/2018 | Lee | H01L 24/24 |
| 10,068,824 B2* | 9/2018 | Kim | H01L 23/3171 |
| 10,098,228 B2* | 10/2018 | Kyozuka | H01L 21/486 |
| 10,163,860 B2* | 12/2018 | Hsu | H05K 1/187 |
| 10,199,337 B2* | 2/2019 | Park | H01L 23/5389 |
| 10,283,443 B2* | 5/2019 | Liao | H01L 23/49822 |
| 10,325,891 B1* | 6/2019 | Lim | H01L 23/49827 |
| 10,340,153 B2* | 7/2019 | Kim | H01L 23/5389 |
| 10,347,585 B2* | 7/2019 | Shin | H01L 24/19 |
| 10,388,614 B2* | 8/2019 | Lee | H01L 24/97 |
| 2009/0218118 A1* | 9/2009 | Tani | H01L 23/5389 |
| | | | 174/256 |
| 2014/0091454 A1* | 4/2014 | Lin | H01L 24/96 |
| | | | 257/734 |
| 2014/0175663 A1* | 6/2014 | Chen | H01L 24/29 |
| | | | 257/774 |
| 2015/0001708 A1* | 1/2015 | Lin | H01L 23/49811 |
| | | | 257/737 |
| 2016/0260684 A1* | 9/2016 | Zhai | H01L 25/0652 |
| 2017/0263573 A1* | 9/2017 | Kim | H01L 24/20 |
| 2018/0053732 A1 | 2/2018 | Baek et al. | |
| 2018/0061795 A1* | 3/2018 | Byun | H01L 23/28 |
| 2019/0148262 A1* | 5/2019 | Pei | H01L 23/3736 |
| | | | 257/713 |
| 2019/0164926 A1* | 5/2019 | Seol | H01L 24/24 |
| 2019/0237382 A1* | 8/2019 | Kim | H01L 21/6835 |
| 2019/0287953 A1* | 9/2019 | Moon | H01L 21/4857 |

FOREIGN PATENT DOCUMENTS

| | | |
|---|---|---|
| JP | 2016-149541 A | 8/2016 |
| KR | 10-1097544 B1 | 12/2011 |
| KR | 10-2017-0106479 A | 9/2017 |

OTHER PUBLICATIONS

Communication dated Sep. 19, 2019, issued by the Taiwan Patent Office in counterpart Taiwan Application No. 107128230.

* cited by examiner

FAN-OUT SEMICONDUCTOR PACKAGE

CROSS-REFERENCE TO RELATED APPLICATION(S)

This application claims the benefit of priority to Korean Patent Application No. 10-2018-0029383 filed on Mar. 13, 2018, in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of package technology suggested to satisfy the technical demand as described above is a fan-out semiconductor package. Such a fan-out semiconductor package has a compact size and may allow a plurality of pins to be implemented by redistributing electrical connection structures outwardly of a region in which a semiconductor chip is disposed.

SUMMARY

An aspect of the present disclosure may provide a fan-out semiconductor package capable of being easily used in a package stack structure through a reduction in warpage.

According to an aspect of the present disclosure, fan-out semiconductor package may be provided, in which an effective coefficient of thermal expansion (CTE) of an upper portion of the fan-out semiconductor package is increased by disposing a dummy metal layer in a core member having a through-hole in which a semiconductor chip is disposed.

According to an aspect of the present disclosure, a fan-out semiconductor package may include: a core member having a first through-hole and including a dummy metal layer; a first semiconductor chip disposed in the first through-hole and having a first active surface having first connection pads disposed thereon and a first inactive surface opposing the first active surface; a first encapsulant covering at least portions of the core member and the first semiconductor chip and filling at least portions of the first through-hole; and a first connection member disposed on the core member and the first active surface of the first semiconductor chip and including a first redistribution layer electrically connected to the first connection pads, wherein the dummy metal layer is electrically insulated from signal patterns of the first redistribution layer, and the dummy metal layer has a thickness greater than that of the first redistribution layer.

According to another aspect of the present disclosure, a fan-out semiconductor package may include: a core member having a first through-hole and including a dummy metal layer disposed at an uppermost portion thereof; a first semiconductor chip disposed in the first through-hole and having a first active surface having first connection pads disposed thereon and a first inactive surface opposing the first active surface; a first encapsulant covering at least portions of the core member and the first semiconductor chip and filling at least portions of the first through-hole; a first connection member disposed on the core member and the first active surface of the first semiconductor chip and including a first redistribution layer electrically connected to the first connection pads; a second semiconductor chip having a second active surface having second connection pads disposed thereon and a second inactive surface opposing the second active surface, the second inactive surface being attached to a lower surface of the first connection member; a second encapsulant disposed on the lower surface of the first connection member and covering at least portions of the second semiconductor chip; a second redistribution layer disposed on the second encapsulant and the second active surface of the second semiconductor chip; second redistribution vias penetrating through at least portions of the second encapsulant and electrically connecting the second connection pads and the second redistribution layer to each other; and third redistribution vias penetrating through the second encapsulant and electrically connecting the first redistribution layer and the second redistribution layer to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
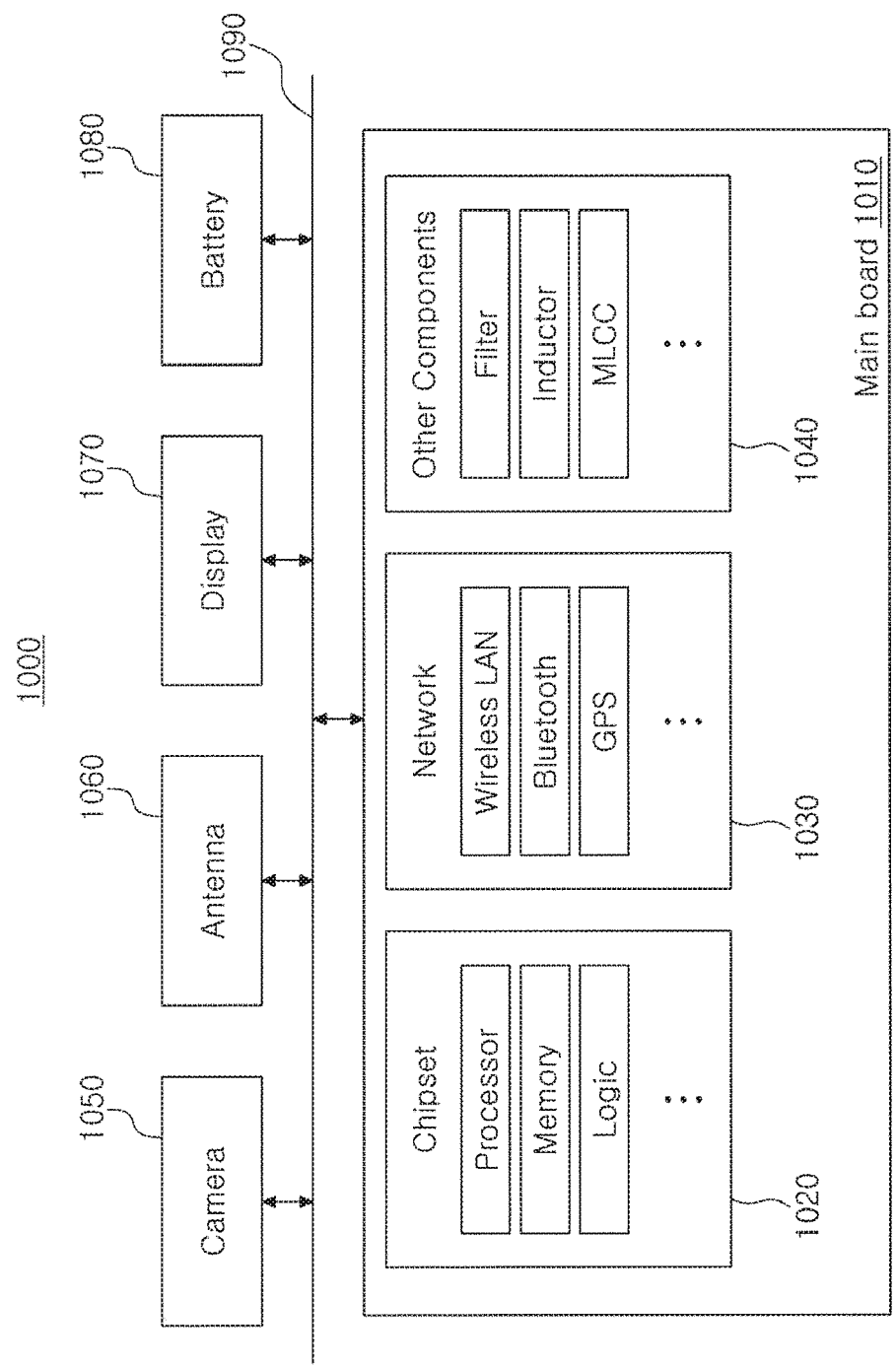
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein, A "connection" of a component to another component herein conceptually includes an indirect connection through a third component as well as a direct connection between two components. In addition, "electrically connected" conceptually includes a physical connection and a physical disconnection. It can be understood that when an element is referred to with terms such as "first." and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRM)), a non-volatile memory (for example, a read only memory (ROM)) a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined, with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated) a gyroscope (riot illustrated), a speaker (not illustrated), a mass storage unit (for example, a hard disk drive) (not illustrated), a compact disk (CD) drive (not illustrated), digital versatile disk (DVD) drive (not illustrated) or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
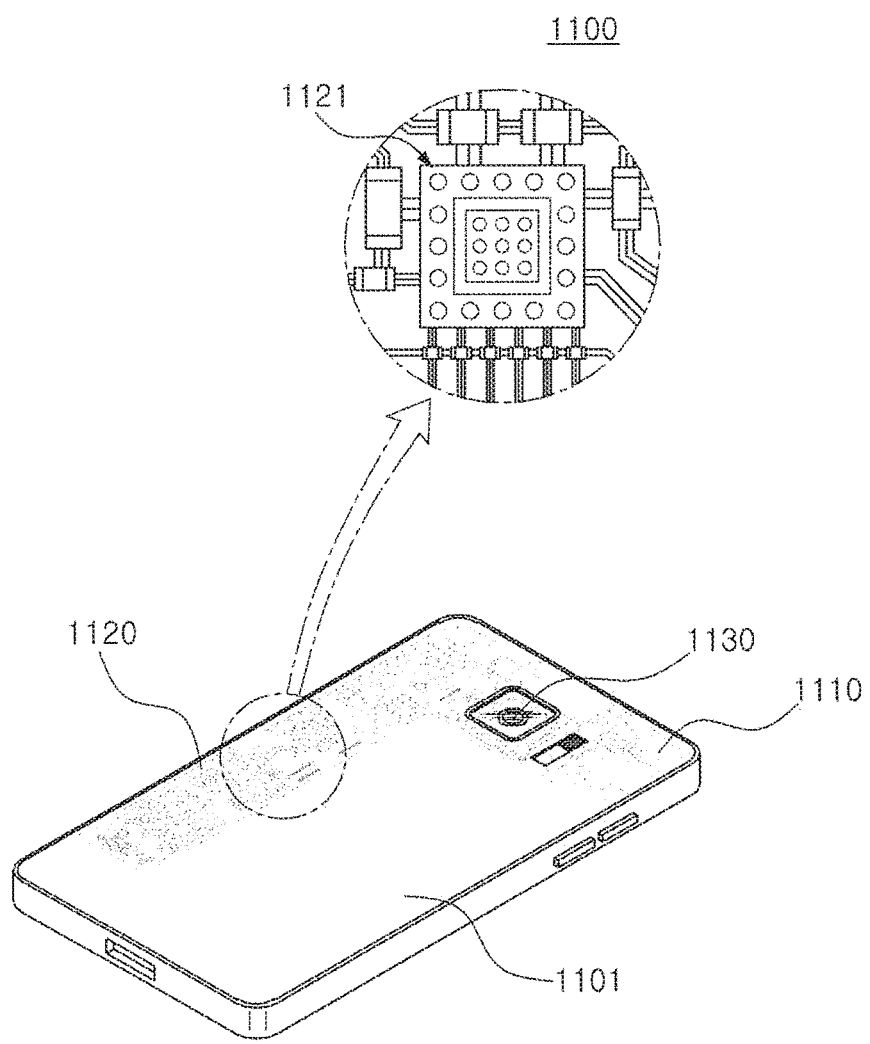
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconducter chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3E are schematic cross-sectional views illustrating states of a fan-in semiconductor package before and after being packaged.

Figure 4:
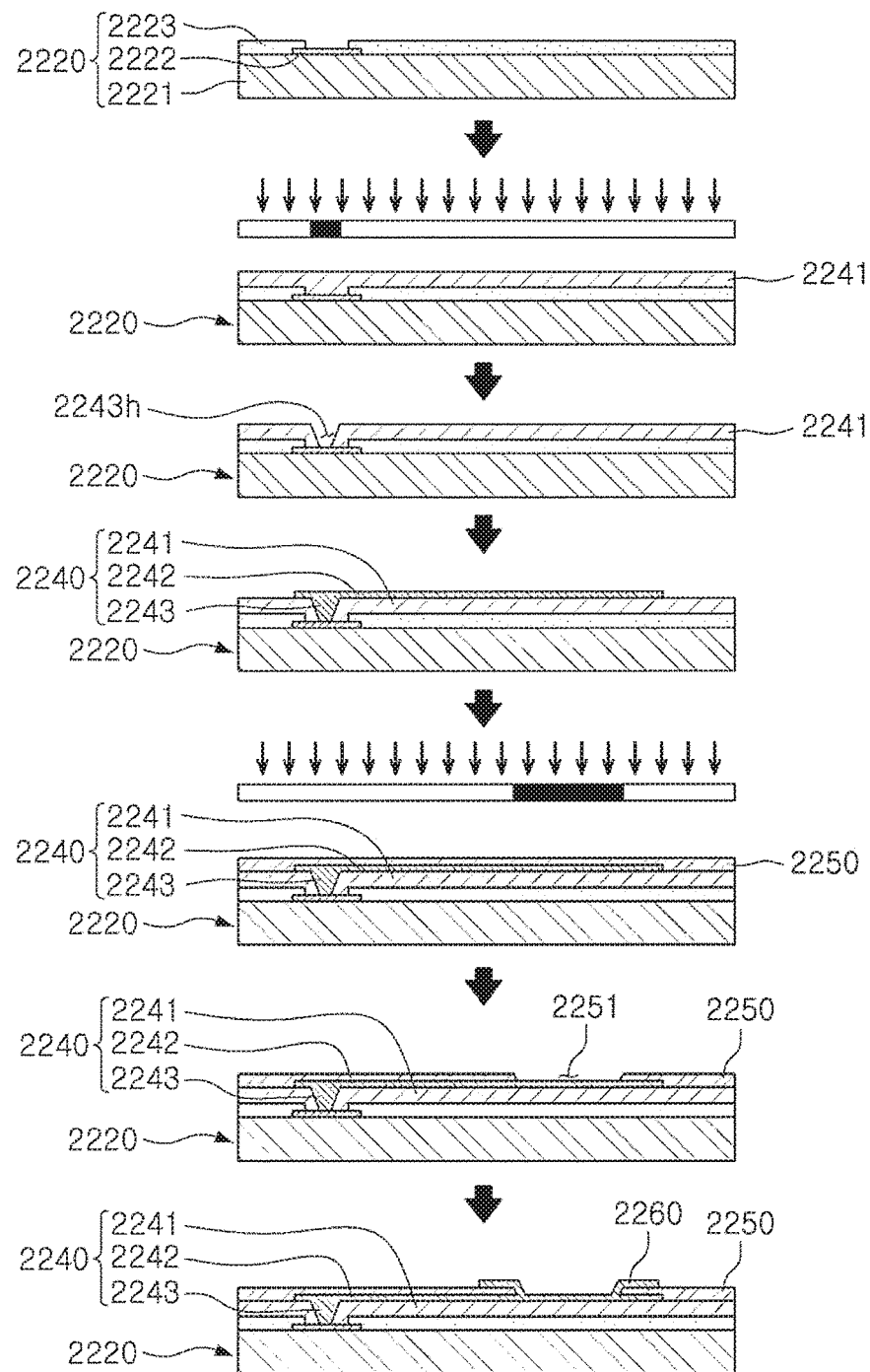
FIG. 4 is schematic cross-sectional views illustrating a packaging process of a fan-in semiconductor package.

FIG. 4 is schematic cross-sectional views illustrating a packaging process of a fan-in semiconductor package.

Figure 3:
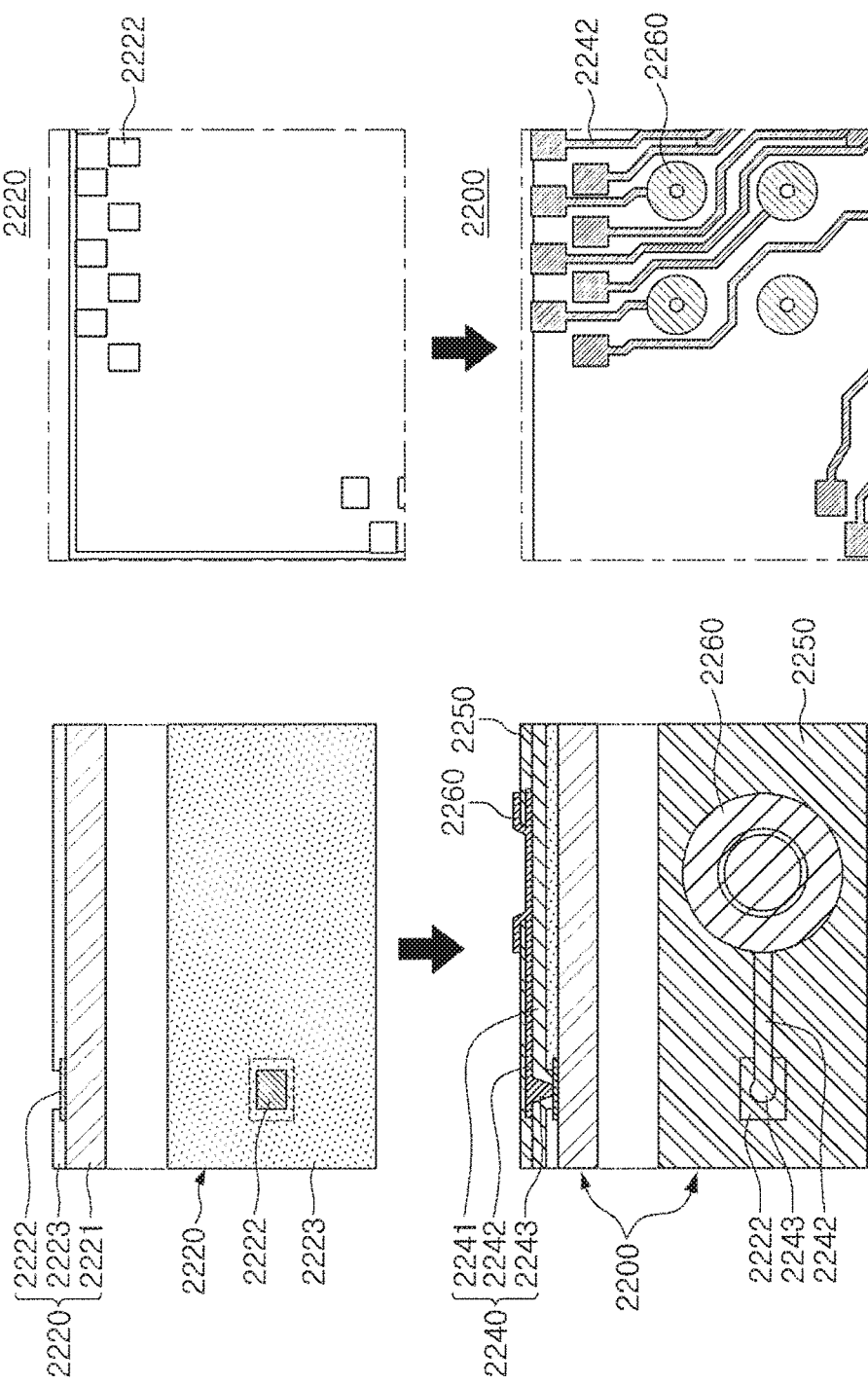
FIGS. 3A and 3B are schematic cross-sectional views illustrating states of a fan-in semiconductor package before and after being packaged.

Referring to FIGS. 3 and 4, a semiconductor chip 2220 may be, for example, an integrated circuit (IC) in a bare state, including a body 2221 including silicon (Si), germanium (Ge) gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
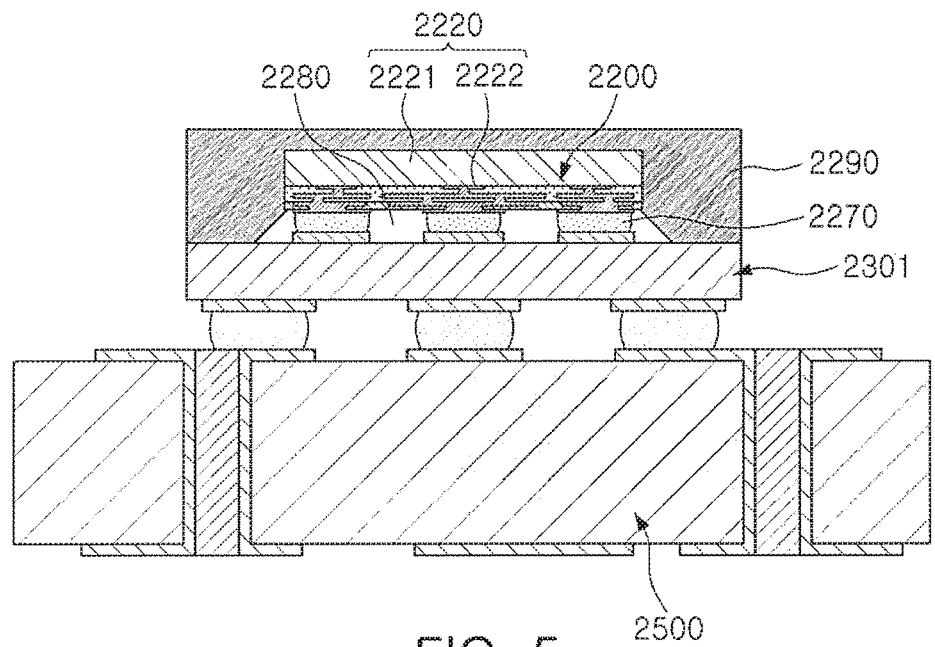
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
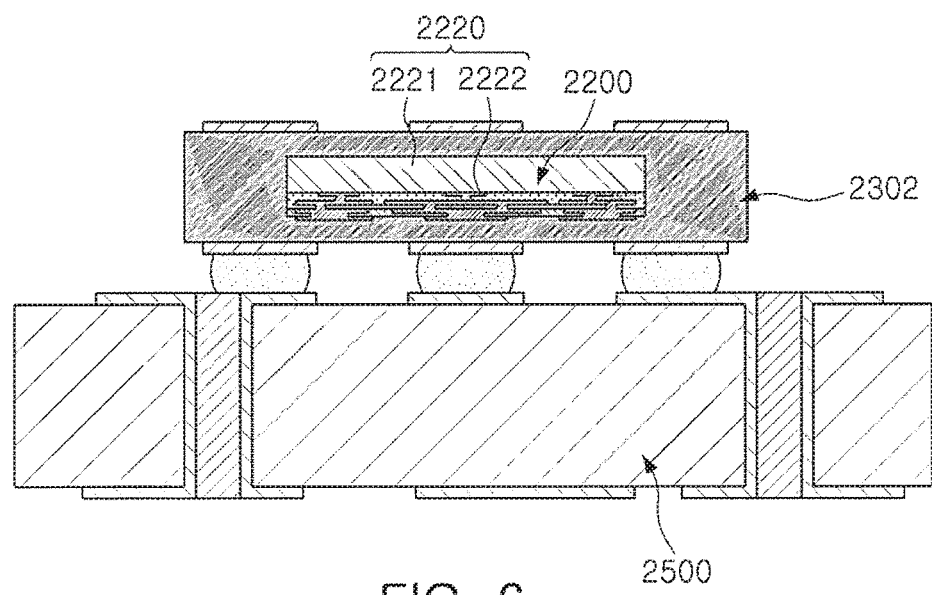
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
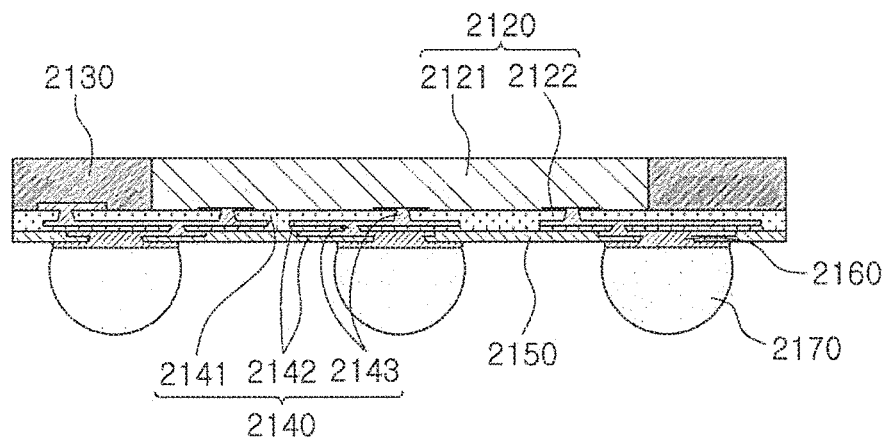
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2150. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-cut semiconductor package may be mounted on the mainboard of the electronic device without using a separate BGA substrate, as described below.

Figure 8:
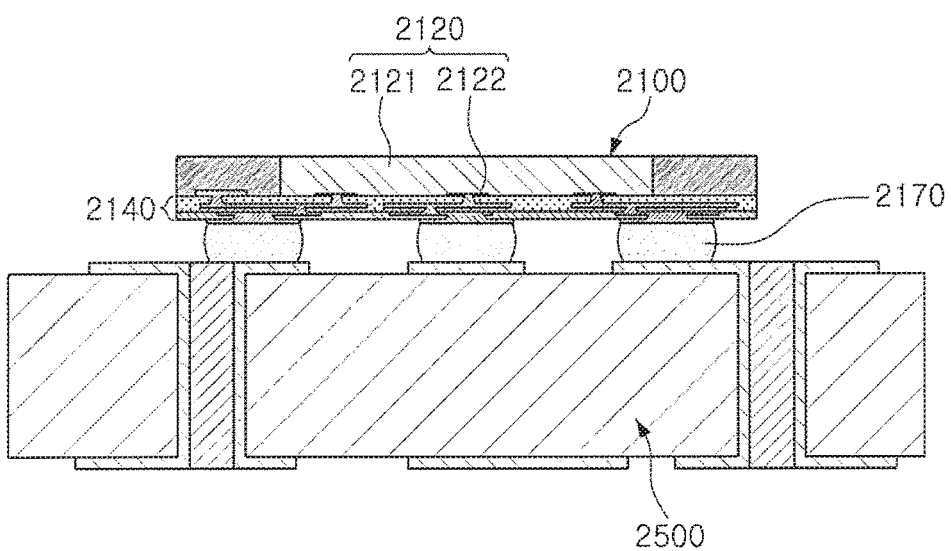
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate EGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that, it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package capable of being easily used in a package stack structure through a reduction in warpage will hereinafter be described with reference to the drawings.

Figure 9:
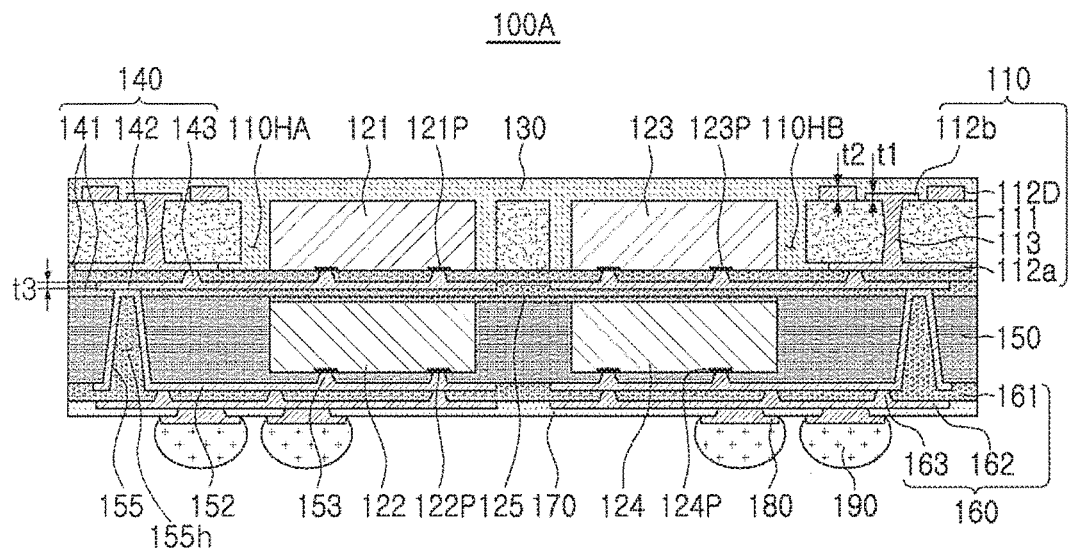
FIG. 9 is a schematic cross-sectional view illustrating an example of a fan-out semiconductor package.

FIG. 9 is a schematic cross-sectional view illustrating an example of a fan-out semiconductor package.

Figure 10:
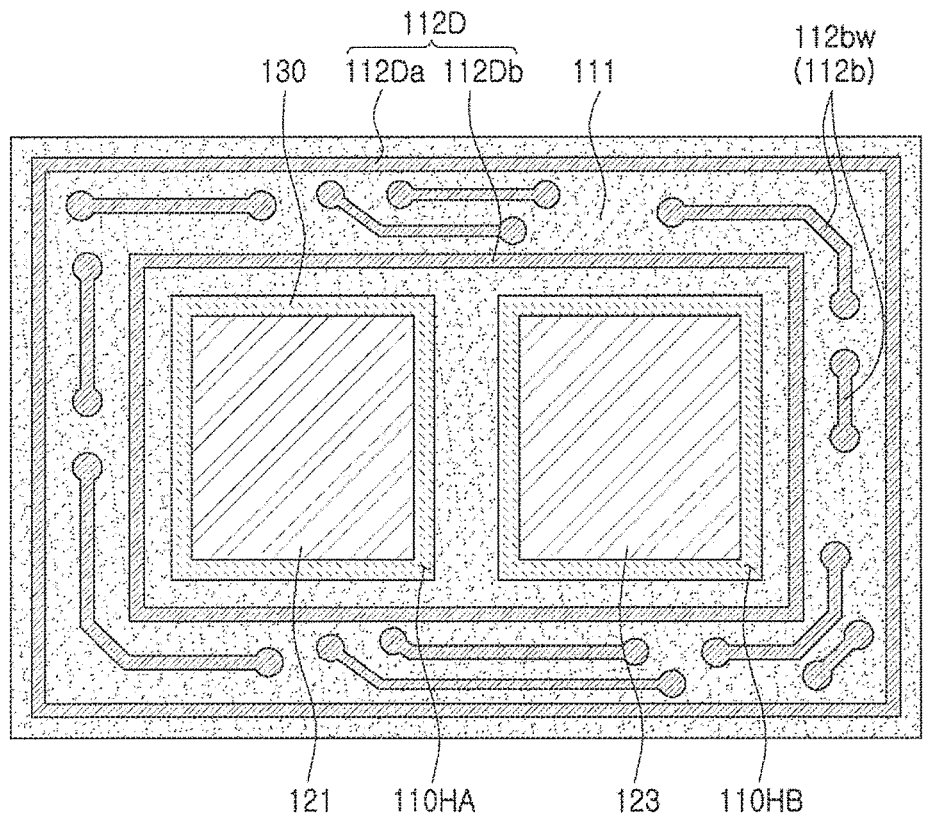
FIG. 10 is a schematic top view of the fan-out semiconductor package of FIG. 9.

FIG. 10 is a schematic top view of the fan-out semiconductor package of FIG. 9.

Referring to FIGS. 9 and 10, a fan-out semiconductor package 100A according to an exemplary embodiment in the present disclosure may include a core member 110 having first and second through-holes 110HA and 110HB spaced apart from each other and including a plurality of wiring layers 112a and 112b and a dummy metal layer 112D; a first semiconductor chip 121 disposed in the first through-hole 110HA and having a first active surface having first connection pads 121P disposed thereon and a first inactive surface opposing the first active surface; a third semiconductor chip 123 disposed in the second through-hole 110H side by side with the first semiconductor chip 121 and having a third active surface having third connection pads 123P disposed thereon and a third inactive surface opposing the first active surface; a first encapsulant 130 covering at least portions of each of the core member 110 and the first and third semiconductor chips 121 and 123 and filling at least portions of each of the first and second through-holes 110HA and 110HB; a first connection member 140 disposed on the core member 110 and the first and third active surfaces and including a first redistribution layer 142 electrically connected to the plurality of wiring layers 112a and 112b and the first and third connection pads 121P and 123P; a second semiconductor chip 122 having a second active surface having second connection pads 122P disposed thereon and a second inactive surface opposing the second active surface, the second inactive surface being attached to a lower surface of the first connection member 140; a fourth semiconductor chip 124 having a fourth active surface having fourth connection pads 124P disposed thereon and a fourth inactive surface opposing the fourth active surface, the fourth inactive surface being attached to the lower surface of the first connection member 140 so that the fourth semiconductor chip 124 is disposed side by side with the second semiconductor chip 122; a second encapsulant 150 disposed on the lower surface of the first connection member 140 and covering at least portions of each of the second and fourth semiconductor chips 122 and 124; a second redistribution layer 152 disposed on the second encapsulant 150 and the second and fourth active surfaces; second redistribution vias 153 penetrating through at least portions of the second encapsulant 150 and electrically connecting each of the second and fourth connection pads 122P and 124P to the second redistribution layer 152; third redistribution vias 155 penetrating through the second encapsulant 150, penetrating through at least portions of the first connection member 140, and electrically connecting the first redistribution layer 142 and the second redistribution layer 152 to each other; a second connection member 160 disposed on the second encapsulant 150 and the second redistribution layer 152 and including a third redistribution layer 162 electrically connected to the second redistribution layer 152; a passivation layer 170 disposed on the second connection member 160 and having openings exposing at least portions of the third redistribution layer 162; underbump metal layers 180 disposed in the openings of the passivation layer 170 and connected to the exposed third redistribution layer 162; and electrical connection structures 190 disposed on the passivation layer 170 and connected to the underbump metal layers 180.

Meanwhile, recently, technology of stacking a plurality of memory chips in multiple stages in order to increase a capacity of a memory has been developed. For example, there may be technology of stacking a plurality of memory chips in two stages (or three stages), mounting the stacked memory chips on an interposer substrate, and then molding the stacked memory chips mounted on the interposer substrate using a molding material to be thus used in a package form. In this case, the stacked memory chips are electrically connected to the interposer substrate by bonding wires. However, in this structure, there is a limitation in thinness due to a significant thickness of the interposer substrate. In addition, when the interposer substrate is manufactured on the basis of silicon, a significant cost is required. In addition, when a reinforcing material holding the stacked memory chips is not separately included, a problem may occur in reliability due to warpage. Further, since the stacked memory chips are electrically connected to the interposer substrate through the bonding wires, such that inputs/outputs (I/Os) of the stacked memory chips are redistributed, a signal path is significantly long, such that signal loss may be frequently generated. In addition, in such a wire bonding manner, connection pads disposed on a central portion of an active surface of a semiconductor chip need to be intentionally redistributed outwardly of the active surface of the semiconductor chip by forming a redistribution layer in order to stack the semiconductor chip. In this case, there is a limitation in an efficient design and disposition of the semiconductor chip. For example, signal loss may be generated due to an increase in the signal path, or the like. In addition, a separate redistribution layer forming process needs to be added, and productivity may thus be reduced.

On the other hand, in the fan-out semiconductor package 100A according to the exemplary embodiment, a signal path is formed through redistribution vias 143, 153, and 155 and redistribution layers 142 and 152 rather than the bonding wires The signal path may thus be significantly reduced.

Therefore, generation of signal loss may also be significantly reduced. That is, signal electrical characteristics may be improved. In addition, the third redistribution vias 155 connecting the redistribution layers 142 and 152 formed on different layers to each other may be formed to have a diameter and a height greater than those of the first redistribution vias 143 and the second redistribution vias 153, resulting in stable transmission of a high current signal, or the like. In addition, the semiconductor chips 121 and 123 disposed on a relatively high level as well as the semiconductor chips 122 and 124 disposed on a relatively low level may be packaged in a bare state, and the connection pads 121P, 122P, 123P, and 124P of the semiconductor chips 121, 122, 123, and 124 respectively may be disposed on central portions of the first to fourth active surfaces. In addition, the first connection member 140 including the first redistribution layer 142, the second redistribution layer 152 disposed on the second encapsulant 150, or the like, may be introduced instead of a separate interposer substrate. Therefore, the redistribution layers 142 and 152 may be distributed to various positions, such that a thickness of the first connection member 140 may be significantly reduced, and a backside encapsulating thickness or a thickness of a stacked chip may also be significantly reduced. In addition, the second and fourth inactive surfaces of the second and fourth semiconductor chips 122 and 124 may be attached to the first connection member 140 using an adhesive member 125 such as a die attach film (DAF), or the like, and the attached second and fourth semiconductor chips 122 and 124 may be encapsulated with the second encapsulant 150 to be thus effectively fixed, such that reliability may be improved.

Meanwhile, in a case of a sequential stack structure of packages such as the fan-out semiconductor package 100A according to the exemplary embodiment, generally, a value of a coefficient of thermal expansion (CTE) of a lower package may be relatively greater than that of a CTE of an upper package, such that a great unit warpage value may be generated at room temperature. However, in the fan-out semiconductor package 100A according to the exemplary embodiment, the core member 110 may be introduced at an upper portion corresponding to the upper package, and unit warpage may be suppressed to some degrees through the core member 110. Particularly, the dummy metal layer 112D having a thickness t2 greater than a thickness t1 of each of the wiring layers 112a and 112b and/or a thickness t3 of the first redistribution layer 142 may be disposed at the uppermost portion of the core member 110 of the fan-out semiconductor package 100A according to the exemplary embodiment, and an effective CTE of an upper portion of the fan-out semiconductor package 100A may be improved through the dummy metal layer 112D, and the unit warpage that is problematic in the sequential stack structure of the packages described above may thus be effectively controlled. That is, it may be effective in reducing warpage.

Meanwhile, a case in which a package structure according to the present disclosure is a kind of sequential stack structure is described in the fan-out semiconductor package 100A according to the exemplary embodiment, but the package structure according to the present disclosure is not necessarily limited to such a stack structure of the packages. That is, a structure itself of the upper package including the core member 110 having the dummy metal layer 112D disposed at the uppermost portion thereof described above may be understood as the package structure according to the present disclosure and components of the lower package may be modified, if necessary. However, in terms of the thinness, the electrical characteristic improving effect, or the like, described above, in addition to the warpage control effect, the components of the lower package described above are desirable.

The respective components included in the fan-out semiconductor package 100A according to the exemplary embodiment will hereinafter be described in more detail.

The core member 110 may maintain rigidity of the fan-out semiconductor package 100A depending on certain materials, and serve to secure uniformity of a thickness of the first encapsulant 130. In addition, due to the core member 110, the fan-out semiconductor package 100A according to the exemplary embodiment may be used as a portion of a package-on-package. The core member 110 may have the first and second through-holes 110HA and 110HB spaced apart from each other. The first and third semiconductor chips 121 and 123 may be disposed in the first and second through-hole 110HA and 110HB, respectively, to be spaced apart from the core member 110 by predetermined distances That is, side surfaces of the first and third semiconductor chips 121 and 123 may be surrounded by the core member 110. However, such a form is only an example and may be variously modified to have other forms, and the core member 110 may perform another function depending on such a form. The core member 110 may include an insulating layer 111 having the first and second through-holes 110HA and 110HB described above, a first wiring layer 112a disposed on a lower surface of the insulating layer 111, a second wiring layer 112b disposed on an upper surface of the insulating layer 111, connection vias 113 penetrating through the insulating layer 111 and electrically connecting the first and second wiring layers 112a and 112b to each other, and the dummy metal layer 112D disposed on the upper surface of the insulating layer 111. The core member 110 may include only the dummy metal layer 112D without including the wiring layers 112a and 112b and the connection vias 113, if necessary. In addition, only the first through-hole 110HA may exist, if necessary, and only the first semiconductor chip 121 may be disposed in the first through-hole 110HA or the first and third semiconductor chips 121 and 123 may be disposed together in the first through-hole 110HA.

A material of the insulating layer 111 is not particularly limited. For example, an insulating material may be used as the material of the insulating layer. In this case, the insulating, material may be a thermosetting resin such as an epoxy resin, a thermoplastic resin such as a polyimide resin, an insulating material in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. The insulating material may be, preferably, prepreg, but is not limited thereto.

Each of the wiring layers 112a and, 112b may include a conductive material such as copper (Cu), aluminum (Al), silver (Ag), tin (Sn), gold (Au) nickel (Ni), lead (Pb), titanium (Ti), or alloys thereof. The wiring layers 112a and 112b may perform various functions depending on designs of corresponding layers For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include various pad patterns such as via pad. The wiring layers 112a and 112b may be electrically connected to the first redistribution layer 142 through the connection vias 113, the first redistribution vias 143, and the like, and may also be electrically connected to the first and third connection pads 121P and 123P through the first redistribution layer 142. In addition, the wiring layers 112a and 112b may also be electrically connected to the second and fourth connection pads 122P and 124P through the second and third redistribution vias 153 and 155 and the second redistribution layer 152. The thickness t1 of each of the wiring layers 112a and 112b may be smaller than the thickness t2 of the dummy metal layer 112D, but may be greater than the thickness t3 of the first redistribution layer 142. Through such a thickness relationship, thinness of the fan-out semiconductor package 100A, may be promoted, and a CTE of an upper portion of the fan-out semiconductor package 100A may be increased to effectively suppress unit warpage.

The connection vias 113 may electrically connect the wiring layers 112a and 112b formed on different layers to each other, resulting in an electrical path in the core member 110. Each of the connection vias 113 may also include a conductive material such as copper (Cu), aluminum (Al), silver (Ag), tin (Sn), gold (Au), nickel (Ni), lead (Pb), titanium (Ti), or alloys thereof. Each of the connection vias 113 may be completely filled with the conductive material, or the conductive material may also be formed along a wall of each of via holes. Each of the connection vias 113 may have a cylindrical shape, an hourglass shape, or the like, but is not limited thereto.

The dummy metal layer 112D may increase the CTE of the upper portion of the fan-out semiconductor package 100A to reduce the unit warpage. The dummy metal layer 112D may be disposed at the uppermost portion of the core member 110 in order to satisfy such an effect. In addition, the dummy metal layer 112D may have the thickness t2 greater than the thickness t1 of at least one 112b of the wiring layers 112a and 112b of the core member 110 and/or the thickness t3 of the first redistribution layer 142. The dummy metal layer 112D may include a metal material such as copper (Cu), aluminum (Al), silver (Ag) tin (Sn), gold (Au), nickel (Ni), lead (Pb), titanium (Ti) alloys thereof. The dummy metal layer 112D may be electrically insulated from the signal patterns of the wiring layers 112a and 112b, and may also be electrically insulated from signal patterns of the first redistribution layer 142. In addition, the dummy metal layer 112D may also be electrically insulated from signal patterns of the second redistribution layer 152. Therefore, the dummy metal layer 112D may also be electrically insulated from connection pads for signals of each of the first to fourth connection pads 121P, 122P, 123P, and 124P. However, the dummy metal layer 112D may be used as a ground, if necessary. In this case, the dummy metal layer 112D may be electrically connected to grounds of each of the wiring layers 112a and 112b and/or the first and second redistribution layers 142 and 152. In addition, the dummy metal layer 112D may also be electrically connected to connection pads for grounds of each of the first to fourth connection pads 121P, 122P, 123P, and 124P. When the fan-out semiconductor package 100A is viewed from the top, the dummy metal layer 112D may include one or more dummy patterns 112Da and 112Db formed along an edge of the core member 110. The respective dummy patterns 112Da and 112Db may be continuously formed without being disconnected, to correspond to an edge of the core member 110. In addition, various wiring patterns 112bw of the second wiring layer 112b may be disposed between the dummy patterns 112Da and 112Db. As described above, the thickness t2 of each of the dummy patterns 112Da and 112Db may be greater than the thickness t1 of each of the wiring patterns 112bW.

The semiconductor chips 121, 122, 123, and 124 may each be an integrated circuit (IC) provided in an amount of several hundred to several million or more elements integrated in a single chip. The IC may be a memory chip such as a volatile memory (such as a DRAM) a non-volatile memory (such as a ROM), a flash memory, or the like, but is not limited thereto. In some cases, the IC may also be a processor chip such as an application processor (AP) or another kind of IC such as a controller, a power management IC (PMIC), or the like. The semiconductor chips 121, 122, 123, and 124 may be integrated circuits that are the same as or different from one another. The active surfaces of the respective semiconductor chips 121, 122, 123, and 124 refer to surfaces of the semiconductor chips 121, 122, 123, and 124 on which the connection pads 121P, 122P, 123P, and 124P are disposed, and the inactive surfaces thereof refer to surfaces opposing the active surfaces. The semiconductor chips 121, 122, 123, and 124 may each be formed on the basis of an active wafer. In this case, a base material of each of bodies of the semiconductor chips 121, 122, 123, and 124 may be silicon (Si), germanium (Ge), gallium arsenide (GaAs), or the like. Various circuits may be formed on each of the bodies. The respective connection pads 121P, 122P, 123P, and 124P may electrically connect the semiconductor chips 121, 122, 123, and 124 to other components A material of each of the connection pads 121P, 122P, 123P, and 124P may be a conductive material such as aluminum (Al) the like. A passivation layer exposing the connection pads 121P, 122P, 123P, and 124P may be formed on each of the bodies, if necessary, and may be an oxide layer, a nitride layer, or the like, or a double layer of an oxide layer and a nitride layer. Other insulating layers, and the like, may also be disposed.

The adhesive marcher 125 may easily attach each of the second and fourth inactive surfaces of the second and fourth semiconductor chips 122 and 124 to the lower surface of the first connection member 140. The adhesive member 125 may be any known tape such as the die attach film (DAF). A material of the adhesive member 125 is not particularly limited. The adhesive member 125 may include, for example, an epoxy component, but is not limited thereto. The second and fourth semiconductor chips 122 and 124 may be more stably mounted through the adhesive member 125, and reliability may thus be improved. Meanwhile, if necessary, only the second semiconductor chip 122 may be attached to the lower surface of the first connection member 140 through the adhesive member 125, and the fourth semiconductor chip 124 may be omitted.

The first encapsulant 130 may protect the core member 110 and the first and third semiconductor chips 121 and 123. An encapsulation form of the first encapsulant 130 is not particularly limited, but may be a form in which the first encapsulant 130 surrounds at least portions of the core member 110 and the first and third semiconductor chips 121 and 123. For example, the first encapsulant 130 may cover at least portions of each of the core member 110 and the first and third inactive surfaces of the first and third semiconductor chips 121 and 123, and may fill at least portions of each of the first and second through-holes 110HA and 110HB. Meanwhile, the first encapsulant 130 may fill the first and second through-holes 110HA and 110HB to thus serve as an adhesive for fixing the first and third semiconductor chips 121 and 123 and reduce buckling of the first and third semiconductor chips 121 and 123 depending on certain materials. The first encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, any known molding material such as an EMC, or the like, may also be used. Alternatively, a material in which a thermosetting resin or a thermoplastic resin is impregnated in an inorganic filler and/or a core material such as a glass fiber (or a glass cloth or a glass fabric), for example, prepreg may also be used as the insulating material.

The first connection member 140 may redistribute the first and third connection pads 121P and 123P. Several tens to several hundreds of first and third connection pads 121P and 123P having various functions may be redistributed by the first connection member 140, and may be physically and/or electrically connected to other components through the second redistribution vias 153, the third redistribution vias 155, and the like, depending on the functions. The first connection member 140 may include a first dielectric layer 141, the first redistribution layer 142 disposed on the first dielectric layer 141, the first redistribution vias 143 penetrating through at least portions of the first dielectric layer 141 and electrically connecting the first and third connection pads 121P and 123P and the first wiring layer 112a to the first redistribution layer 142. The number of first dielectric layers 141 may be plural. The first connection member 140 may include larger numbers of first dielectric layers 141, first redistribution layers 142, and first redistribution vias 143, if necessary.

A material of the first dielectric layer 141 may be an insulating material. In this case, a photosensitive insulating material such as a PID resin may also be used as the insulating material. That is, the first dielectric layer 141 may be a photosensitive insulating layer. When the first dielectric layer 141 has photosensitive properties, the first dielectric layer 141 may be formed to have a smaller thickness, and a fine pitch of the first redistribution via 143 may be achieved more easily. The first dielectric layer 141 may be a photosensitive insulating layer including an insulating resin and an inorganic filler. When the first dielectric layers 141 are multiple layers, materials of the first dielectric layers 141 may be the same as each other, and may also be different from each other, if necessary, and the first dielectric layers 141 may be integrated with each other depending on a process, such that a boundary therebetween may also not be apparent.

The first redistribution layer 142 may serve to redistribute the first and third connection pads 121P and 123P to other regions. A material of the first redistribution layer 142 maybe a conductive material such as copper (Cu), aluminum (Al), silver (Ag), tin (tin), gold (Au), nickel. (Ni), lead (Pb), titanium (Ti), or alloys thereof. The first redistribution layer 142 may perform various functions depending on a design of a corresponding layer. For example, the first redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 142 may include various pad patterns such as via pads, electrical connection structure pads, and the like.

The first redistribution vias 143 may electrically connect the first redistribution layer 142, the first and third connection pads 121P and 123P, and the first wiring layer 112a formed on different layers to each other, resulting in an electrical path. A material of each of the first redistribution vias 143 may be a conductive material such as copper (Cu), aluminum (Al), silver (Ag), tin (Sn), gold (Au), nickel (Ni) lead (Pb), titanium (Ti), or alloys thereof. Each of the first redistribution vias 143 may be completely filled with the conductive material, or the conductive material may also be formed along a wall of each of via holes. In addition, each of the first redistribution vias 143 may have a tapered shape, or the like. In embodiments where plural first redistribution layers 142 are formed, the first redistribution vias 143 may penetrate through the plural first dielectric layers 141 at appropriate locations to connect the plural first redistribution layers 142 with each other.

The second encapsulant 150 may protect the second and fourth semiconductor chips 122 and 124. An encapsulation form of the second encapsulant 150 is not particularly limited, but may be a form in which the second encapsulant 150 surrounds at least portions of the second and fourth semiconductor chips 122 and 124. For example, the second encapsulant 150 may cover at least portions of each of the second and fourth active surfaces of the second and fourth semiconductor chips 122 and 124, and may cover at least portions of side surfaces of the second and fourth semiconductor chips 122 and 124. The second encapsulant 150 may include an insulating material. A PID, or the like, may be used as the insulating material. However, the insulating material is not limited thereto. That is, a material including an inorganic filler and an insulating resin, for example, a thermosetting resin such as an epoxy resin, a thermoplastic resin such as a polyimide resin, or a resin having a reinforcing material such as an inorganic filler impregnated in the thermosetting resin and the thermoplastic resin, more specifically, ABF, or the like, may be used as the insulating material. In addition, any known molding material such as an EMC, or the like, may also be used. Alternatively, prepreg in which a thermosetting resin or a thermoplastic resin is impregnated in an inorganic filler and/or a core material such as a glass fiber (or a glass cloth or a glass fabric) may also be used as the insulating material.

The second redistribution layer 152 may serve to redistribute the second and fourth connection pads 122P and 124P to other regions. The second redistribution layer 152 may be electrically connected to the first redistribution layer 142 to also redistribute the first and third connection pads 121P and 123P. The second redistribution layer 152 may be disposed on the second encapsulant 150 and the second and fourth active surfaces of the second and fourth semiconductor chips 122 and 124. A material of the second redistribution layer 152 may be a conductive material such as copper (Cu), aluminum (Al), silver (Ag), tin (Sn), gold. (Au), nickel (Ni), lead (Pb), titanium (Ti) or alloy thereof. The second redistribution layer 152 may perform various functions depending on a design of corresponding layer. For example, the second redistribution layer 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 152 may include various pad patterns such as via pads, electrical connection structure pads, and the like.

The second redistribution vias 153 may electrically connect the second redistribution layers 152, the second and fourth connection pads 122P and 124P, and the like, formed on different layers to each other, resulting in an electrical path. The second redistribution, vias 153 may penetrate through the second encapsulant 150, and may be in contact with the second and fourth connection pads 122P and 124P. A material of each of the second redistribution vias 153 may be a conductive material such as copper (Cu), aluminum (Al), silver (Ag), tin (Sn), gold (Au), nickel (Ni), lead (Pb), titanium (Ti), or alloys thereof. Each of the second redistribution vias 153 may be completely filled with the conductive material, or the conductive material may also be formed along a wall of each of via holes. Each of the second redistribution vias 153 may have a reverse tapered shape of which a lower diameter is greater than an upper diameter, and it may be advantageous in a process that each of the second redistribution vias 153 has such a form.

The third redistribution vias 155 may electrically connect the first redistribution layer 142 and the second redistribution layer 152 formed on different layers to each other, resulting in an electrical path. The third redistribution vias 155 may penetrate through the second encapsulant 150, and may also penetrate through at least portions of the first connection member 140, that is, at least portions of the first dielectric layer 141. A material of each of the third redistribution vias 155 may be a conductive material such as copper (Cu), aluminum (Al), silver (Ag), tin (Sn), gold (Au), nickel (Ni), lead (Pb), titanium (Ti), or alloys thereof. Each of the third redistribution vias 155 may be completely filled with the conductive material, or the conductive material may also be formed along a wall of each of via holes. When the third redistribution vias 155 are formed at a predetermined thickness along walls of via holes 155h penetrating through the second encapsulant 150 and the first connection member 140, spaces between the third redistribution vias 155 of the via holes 155h may be filled with a second dielectric layer 161 of the second connection member 160. Each of the third redistribution vias 155 may have a tapered shape of which a lower diameter is greater than an upper diameter, and it may be advantageous in a process that each of the third redistribution vias 155 has such a form. That is, when the third redistribution via 155 is cut by a surface perpendicular the first and third active surfaces, a cut surface of the third redistribution via 155 may have a taper shape. A diameter of the third redistribution via 155 may be greater than that the second redistribution via 153. In detail, when the second and third redistribution vias 153 and 155 are cut on the same level by a surface parallel with the second and fourth active surfaces, a length of a long side of a cut surface of the third redistribution via 155 maybe greater than that of a long side of a cut surface of the second redistribution via 153 on any level. In addition, a height of the third redistribution via 155 may be greater than that of the second redistribution via 153. That is, the second redistribution via 153 and the third redistribution via 155 may have a form of a multi-stage via capable of stably transmitting a signal, or the like.

The second connection member 160 may be electrically connected to the second redistribution layer 152 to additionally redistribute the first to fourth connection pads 121P, 122P, 123P, and 124P. The second connection member 160 may include the second dielectric layer 161, the third redistribution layer 162 disposed on the second dielectric layer 161, and fourth redistribution vias 164 penetrating through at least portions of the second dielectric layer 161 and electrically connecting the second redistribution layer 152 and the third redistribution layer 162 to each other. The second connection member 160 may include larger numbers of second dielectric layers 161, third redistribution layers 162, and fourth redistribution vias 163, if necessary. The second connection member 160 may be omitted, if necessary.

A material of the second dielectric layer 161 may be an insulating material. In this case, a photosensitive insulating material such as a PID resin may also be used as the insulating material. That is, the second dielectric layer 161 may be a photosensitive insulating layer. When the second dielectric layer 161 has photosensitive properties, the second dielectric layer 161 may be formed to have a smaller thickness, and a fine pitch of the fourth redistribution via 163 may be achieved more easily. The second dielectric layer 161 may be a photosensitive insulating layer including an insulating resin and an inorganic filler. When the second dielectric layers 161 are multiple layers, materials of the second dielectric layers 161 may be the same as each other, and may also be different from each other, if necessary, and the second dielectric layers 161 may be integrated with each other depending on a process, such that a boundary therebetween may also not be apparent.

The third redistribution layer 162 may serve to redistribute the first to fourth connection pads 121P, 122P, 123P, and 124P to other regions. A material of the third redistribution layer 162 may be a conductive material such as copper (Cu), aluminum (Al), silver (Ag), tin (Sn), gold (Au), nickel (Ni), lead (Pb), titanium (Ti) or alloys thereof. The third redistribution layer 162 may perform various functions depending on a design of a corresponding layer. For example, the third redistribution layer 162 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the third redistribution layer 162 may include various pad patterns such as via pads, electrical connection structure pads, and the like.

The fourth redistribution vias 163 may electrically connect the second redistribution layer 152 and the third redistribution layer 162 formed on different layers to each other, resulting in an electrical path. A material of each of the fourth redistribution vias 163 may be a conductive material such as copper (Cu), aluminum (Al), silver (Ag), tin (Sn), gold (Au), nickel (Ni), lead (Pb), titanium (Ti), or alloys thereof. Each of the fourth redistribution vias 163 may be completely filled with the conductive material, or the conductive material may also be formed along a wall of each of via holes In addition, each of the fourth redistribution vias 163 may have a tapered shape, or the like.

The passivation layer 170 may protect the third redistribution layer 162, and the like, from external physical or chemical damage, or the like. The passivation layer 170 may have the openings exposing at least portions of the third redistribution layer 162. The number of openings formed in the passivation layer 170 may be several tens to several thousands. A material of the passivation layer 170 is not particularly limited, but may be a photosensitive insulating material such as a PID resin. Alternatively, a solder resist may also be used as the material of the passivation layer 170. Alternatively, an insulating resin that does not include a core material, but includes a filler, for example, ABF including an inorganic filler and an epoxy resin may be used as the material of the passivation layer 170. When the second connection member 160 is omitted, the openings of the passivation layer 170 may expose at least portions of the second redistribution layer 152.

The underbump metal layers 180 may improve connection reliability of the electrical connection structures 190, and improve hoard level reliability of the fan-out semiconductor package 100A. The underbump metal layer 180 may be connected to the third redistribution layer 162 opened through the openings of the passivation layer 170. The underbump metal layers 180 may be formed in the openings of the passivation layer 170 by any known metallization method using any known conductive material such as a metal, hut are not limited thereto. The underbump metal layers 180 may be omitted, if necessary.

The electrical connection structures 190 may be additionally configured to physically or electrically externally connect the fan-out semiconductor package 100A. For example, the fan-out semiconductor package 100A may be mounted on the mainboard of the electronic device through the electrical connection structures 190. Each of the electrical connection structures 190 may be formed of a low melting point metal, for example, tin (Sn) or an, alloy including tin (Sn), more specifically, a solder. However, this is only an example, and a material of each of the electrical connection structures 190 is not particularly limited thereto. Each of the electrical connection structures 190 may be a land, a ball, a pin, or the like. The electrical connection structures 190 may be formed as a multilayer or single layer structure. When the electrical connection structures 190 are formed as a multilayer structure, the electrical connection structures 190 may include a copper (Cu) pillar and a solder. When the electrical connection structures 190 are formed as a single layer structure, the electrical connection structures 190 may include a tin-silver solder or copper (Cu) However, this is only an example, and the electrical connection structures 190 are not limited thereto.

The number, an interval, a disposition form, and the like, of electrical connection structures 190 are not particularly limited, but may be sufficiently modified depending on design particulars by those skilled in the art. For example, the electrical connection structures 190 may be provided in an amount of several tens to several thousands or may be provided in an amount of several tens to several thousands or more or several tens to several thousand or less. When the electrical connection structures 190 are solder balls, the electrical connection structures 190 may cover side surfaces of the underbump metal layers 180 extending onto one surface of the passivation layer 170, and connection reliability may be more excellent.

At least one of the electrical connection structures 190 may be disposed in a fan-out region. The fan-out region refers to a region except for a region in which the first to fourth semiconductor chips 121, 122, 123, and 124 are disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal layer may further be disposed on each of walls of the first and second, through-holes 110HA and 110HB, if necessary. The metal layer may serve to effectively dissipate heat generated from the semiconductor chips 121 and 123. In addition, the metal layer may also serve to block electromagnetic waves. Further, separate passive components such as capacitors, inductors, or the like, in addition to the semiconductor chips 121 and 123, may be disposed in the first and second through-holes 110HA and 110HB. In addition to the structures described above, any structures known in the related art may be applied.

FIGS. 11 through 15 are schematic views illustrating processes of manufacturing the fan-out semiconductor package of FIG. 9.

Figure 11:
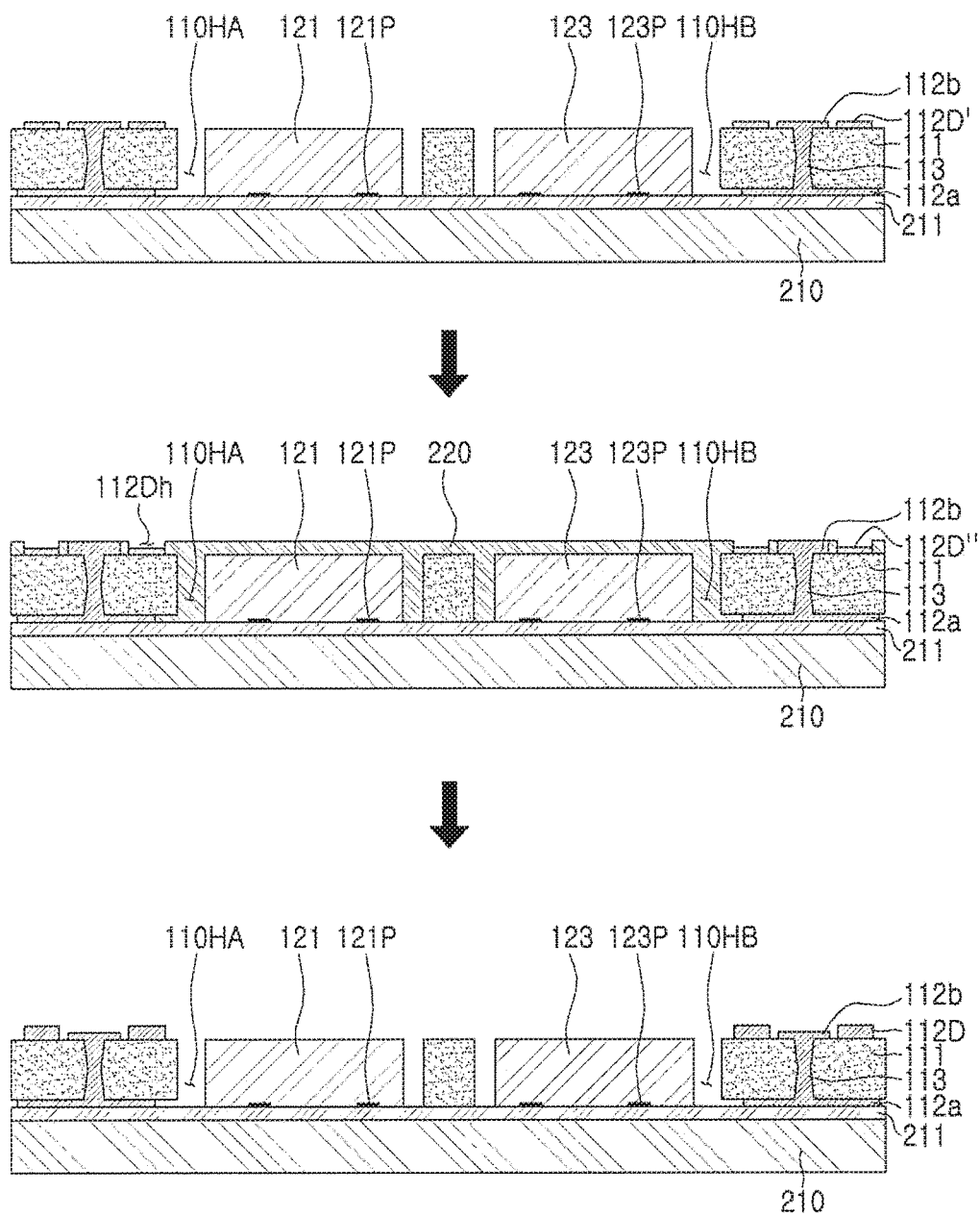
FIGS. 11 through 15 are schematic views illustrating processes of manufacturing the fan-out semiconductor package of FIG. 9.

First, referring to FIG. 11, the wiring layers 112a and 112b, the connection vias 113, and a base dummy metal layer 112D' may be formed on, in, and on the insulating layer 111 on the basis of a copper clad laminate (CCL), or the like. Via holes for the connection vias 113 may be formed using a mechanical drill, a laser drill, or the like, and the wiring layers 112a and 112b, the connection vias 113, and the base dummy metal layer 112D' may be formed by a plating process. The plating process may be a subtractive process, an additive process, a semi-additive process (SAP), a modified semi-additive process (MSAP), or the like, but is not limited thereto. When the via holes for the connection vias 113 are formed, the first and second through-holes 110HA and 110HB may also be formed using a mechanical drill, a laser drill, or the like. Then, a first carrier 210 including an adhesive film 211 may be attached to a lower portion of the insulating layer 111 on, in, and on which the wiring layers 112a and 112b, the connection vias 113, and the base dummy metal layer 112D' are formed. Then, the first and third semiconductor chips 121 and 123 may be disposed in a face-down form on the adhesive film 211 of the first carrier 210 exposed through the first and second through-holes 110HA and 110HB. Then, a dry film 220 may be laminated, pattern holes 112Db for forming the dummy metal layer 112D by a photolithography method, and plating may be additionally performed on the base dummy metal layer 112D' by the plating process described above to form the dummy metal layer 112D. Then, the dry film 220 may be removed. As described above, the dummy metal layer 112D may be formed by a plurality of plating processes, and may thus include a plurality of plating layers. Therefore, the dummy metal layer 112D may have a thickness greater than that of each of the wiring layers 112a and 112b.

Figure 12:
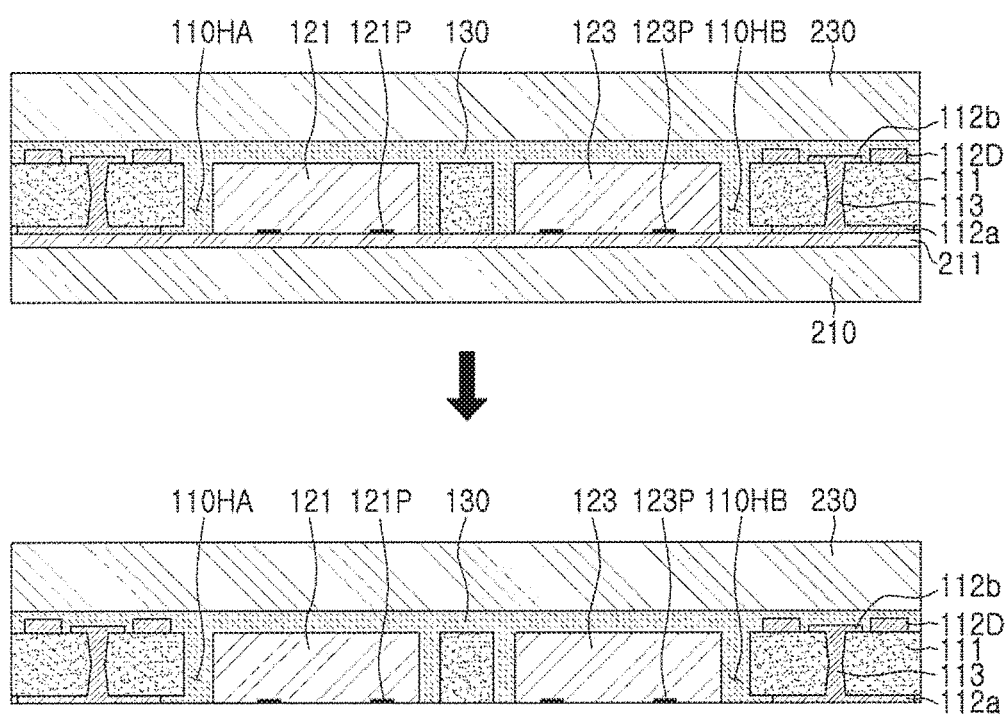

Then, referring to FIG. 12, the core member 110 and the first and third semiconductor chips 121 and 123 may be encapsulated using the first encapsulant 130. The first encapsulant 130 may be formed by a lamination method or any known applying method. Then, a second carrier 230 may be attached onto the first encapsulant 130, and the first carrier 210 including the adhesive film 211 may be removed.

Figure 13:
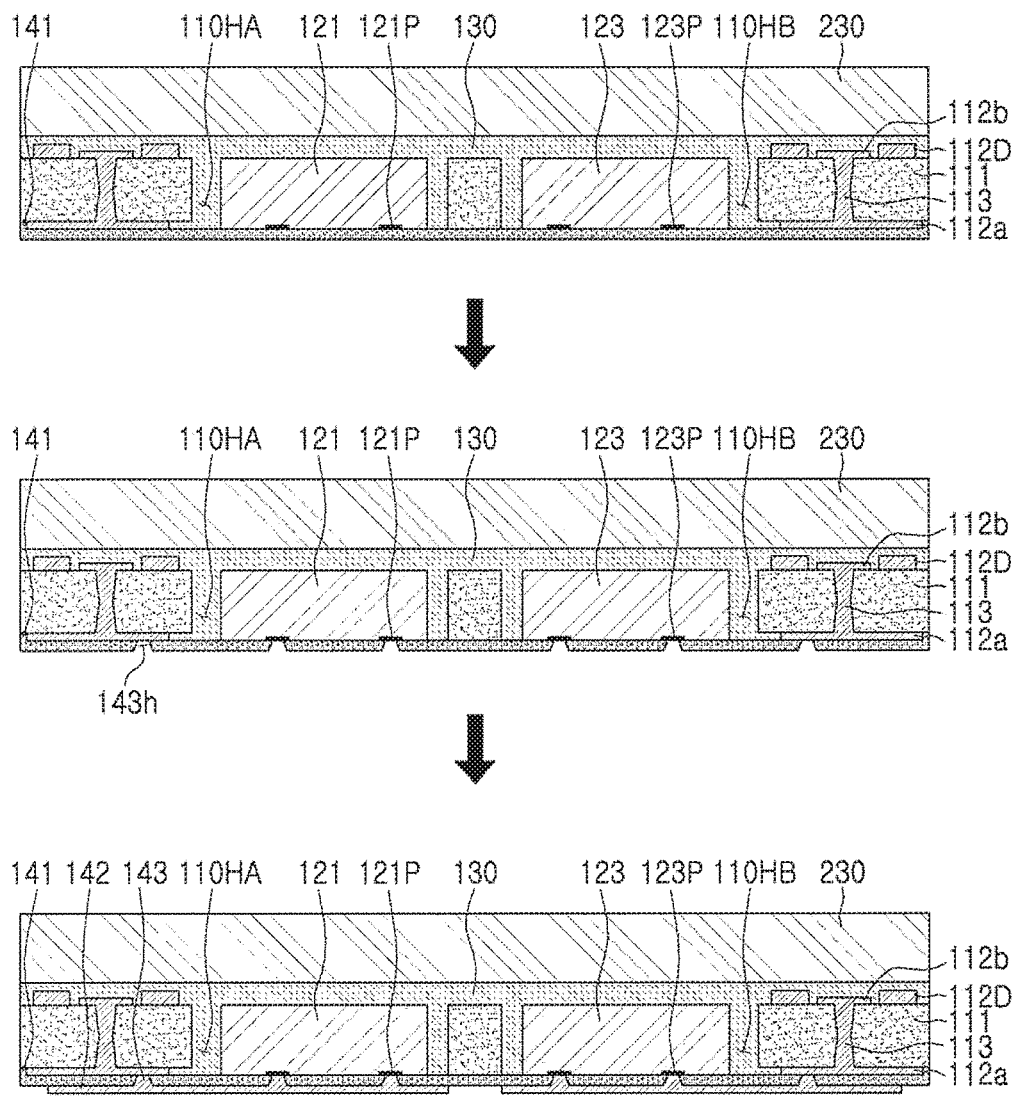

Then, referring to FIG. 13, a 1$^{st}$ first dielectric layer 141 may be formed on the core member 110 and the first and third active surfaces of the first and third semiconductor chips 121 and 123 by laminating or applying a PID, or the like. Then, via holes 143h may be formed in the 1$^{st}$ first dielectric layer 141 by a photolithography process. Then, the first redistribution layer 142 and the first redistribution vias 143 may be formed by the plating process described above.

Figure 14:
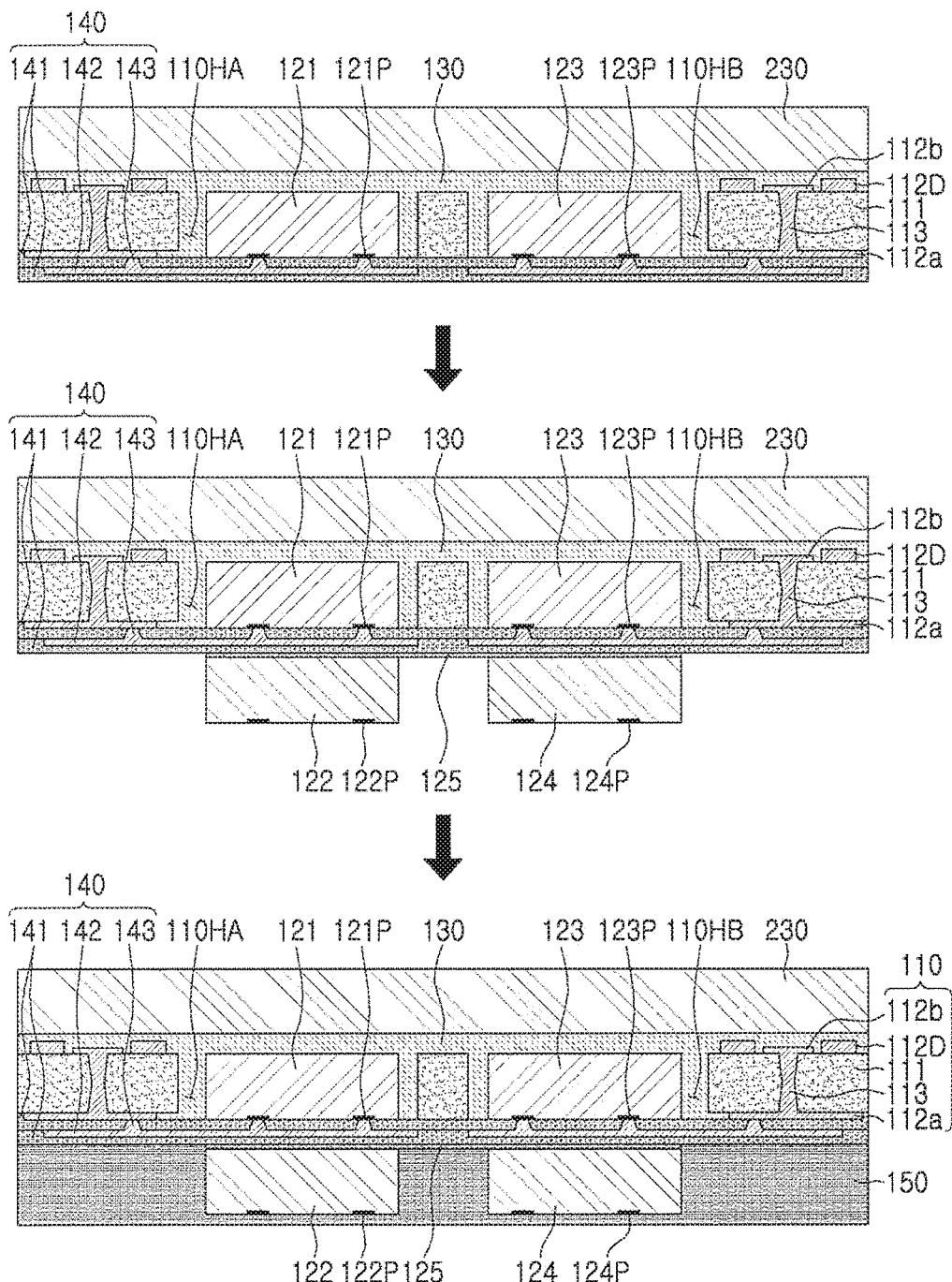

Then, referring to FIG. 14, a 2$^{nd}$ first dielectric layer 141 covering the first redistribution layer 142 may be formed on the 1$^{st}$ first dielectric layer 141 by laminating or applying a PID. The first connection member 140 may be formed by repeating these processes, if necessary. Then, the second and fourth inactive surfaces of the second and fourth semiconductor chips 122 and 124 may be attached to the lower surface of the first connection member 140 through the adhesive member 125. In more detail, the second and fourth inactive surfaces of the second and fourth semiconductor chips 122 and 124 may be attached to a lower surface of the first dielectric layer 141. Then, the second and fourth semiconductor chips 122 and 124 may be encapsulated using the second encapsulant 150. The second encapsulant 150 may also be formed by a lamination method or an applying method.

Figure 15:
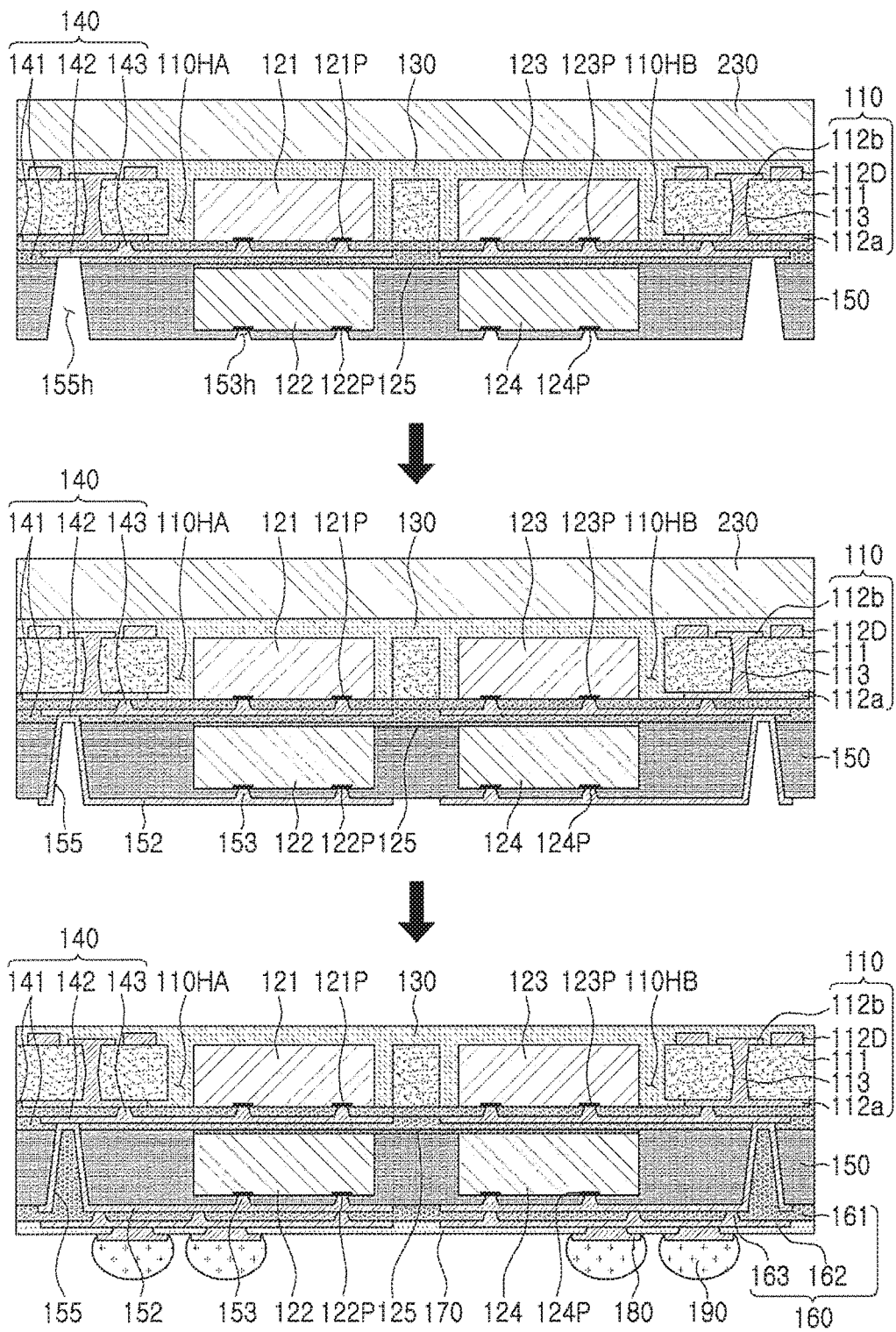

Then, referring to FIG. 15, via holes 153h and 155h for the second and third redistribution vias 153 and 155 may be formed. The via holes 153h and 155h may also be formed using a mechanical drill and/or a laser drill. Alternatively, the via holes 153h and 155h may also be formed by a photolithography method depending on a material of the second encapsulant 150. Then, the second redistribution layer 152 and the second and third redistribution vias 153 and 155 may be formed by the plating process described above. Then, the second connection member 160 may be formed by a method similar to the method of forming the first connection member 140, and the passivation layer 170 and the underbump metal layers 180 may be sequentially formed. The passivation layer 170 may be formed by any known lamination method, hardening method, or the like, and the underbump metal layers 180 may be formed by any known metallization method. Then, the second carrier 230 may be removed, and the electrical connection structures 190 may be formed by a reflow process, or the like. Resultantly, the fan-out semiconductor package 100A according to the exemplary embodiment described above may be obtained. Meanwhile, a series of processes may be processes of preparing the core member 110 having a large size, manufacturing a plurality of fan-out semiconductor packages, and then singulating the plurality of fan-out semiconductor packages into individual fan-out semiconductor packages through a sawing process in order to facilitate mass production. In this case, productivity may be increased multi-fold.

Figure 16:
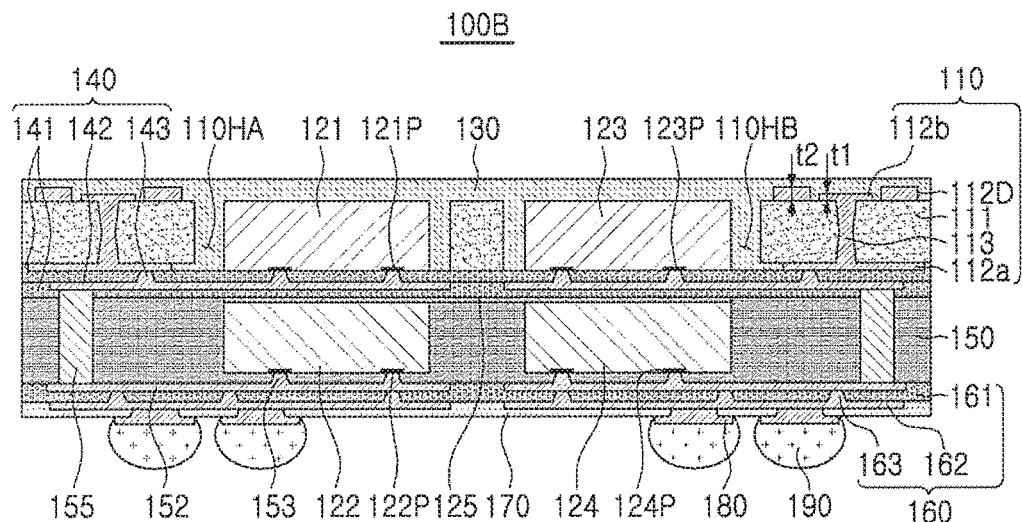
FIG. 16 is a schematic cross-sectional view illustrating another example of a fan-out semiconductor package.

FIG. 16 is a schematic cross-sectional view illustrating another exam of a fan-out semiconductor package.

Referring to FIG. 16, in a fan-out semiconductor package 100B according to another exemplary embodiment in the present disclosure, third redistribution vias 155 may have a shape of a metal post. That is, the third redistribution vias 155 may also be formed in the shape of the metal post, if necessary. The metal post may be, for example, a copper post, but is not limited thereto. A description of other configurations and a manufacturing method overlaps that described above, and is thus omitted.

Figure 17:
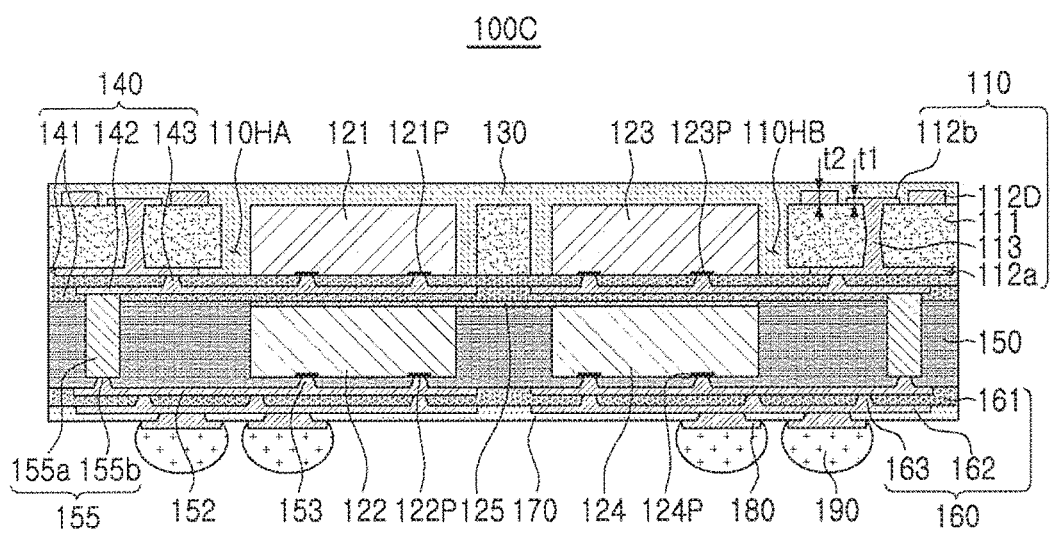
FIG. 17 is a schematic cross-sectional view illustrating another example of a fan-out semiconductor package.

FIG. 17 is a schematic cross-sectional view illustrating another example of a fan-out semiconductor package.

Referring to FIG. 17, in a fan-out semiconductor package 100C according to another exemplary embodiment in the present disclosure, third redistribution vias 155 may include metal posts 155a and via conductors 155b. That is, the third redistribution vias 155 may also be formed to include both of the metal posts 155a and the via conductors 155b, if necessary. A description of other configurations and a manufacturing method overlaps that described above, and is thus omitted.

Figure 18:
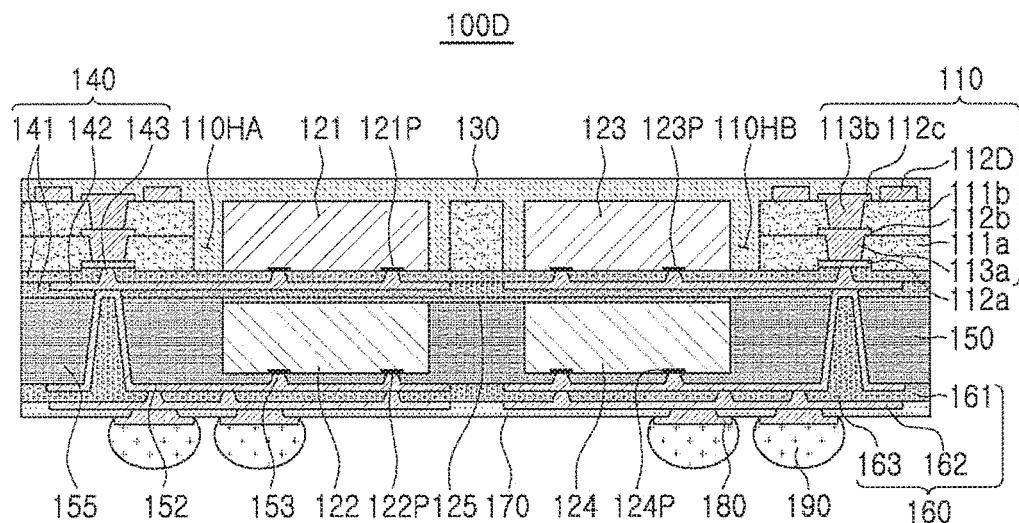
FIG. 18 is a schematic cross-sectional view illustrating another example of a fan-out semiconductor package.

FIG. 18 is a schematic cross-sectional view illustrating another example of a fan-out semiconductor package.

Referring to FIG. 18, in a fan-out semiconductor package 100D according to another exemplary embodiment in the present disclosure, a core member 110 may include a first insulating layer 111a in contact with a first connection member 140, a first wiring layer 112a in contact with the first connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c and a dummy metal layer 112D disposed on the second insulating layer 111b. Since the core member 110 may include a large number of wiring layers 112a, 112b, and 112c, the core member 110 may perform some of roles of the first connection member 140, such that the first connection member 140 may be simplified. Therefore, a decrease in a yield of first and third semiconductor chips 121 and 123 due to a defect occurring in a process of forming the first connection member 140 may be suppressed. Since the first wiring layer 112a is embedded in the first insulating layer 111a, an insulating distance of a first dielectric layer 141 of the first connection member 140 may be relatively constant. The first wiring layer 112a may be recessed into the first insulating layer 111a, such that a lower surface of the first insulating layer 111a and a lower surface of the first wiring layer 112a may have a step therebetween. Resultantly, a phenomenon in which a first encapsulant 130 bleeds into the first wiring layer 112a may be prevented. The first to third wiring layers 112a, 112b, and 112c may be electrically connected to each other through first and second connection vias 113a and 113b each penetrating through the first and second insulating layers 111a, and 111b. The first to third wiring layers 112a, 112b, and 112c may be electrically connected to a first redistribution layer 142, and the dummy metal layer 112D may have a thickness greater than that of each of the first to third wiring layers 112a, 112b, and 112c.

The lower surface of the first wiring layer 112a of the core member 110 may be disposed on a level above upper surfaces of first and third connection pads 121P and 123P. In addition, a distance between the first redistribution layer 142 of the first connection member 140 and the first wiring layer 112a of the core member 110 may be greater than that between the first redistribution layer 142 of the first connection member 140 and the first and third connection pads 121P and 123P. The reason is that the first wiring layer 112a may be recessed into the first insulating layer 111a. The second wiring layer 112b of the core member 110 may be disposed on a level between a first active surface and a first inactive surface of the first semiconductor chip 121 and/or a level between a third active surface and a third inactive surface of the third semiconductor chip 123.

A thickness of each of the first to third wiring layers 112a, 112b, and 112c of the core member 110 may be greater than that of the first redistribution layer 142 of the first connection member 140. Since the core member 110 may have a thickness equal to or greater than that of the first semiconductor chip 121, the first to third wiring layers 112a, 112b, and 112c may be formed to have large sizes depending on a scale of the core member 110. On the other hand, the first redistribution layer 142 of the first connection member 140 may be formed to have a relatively small size for thinness.

The core member 110 may be prepared by, for example, preparing a carrier film having a metal layer formed on one surface or opposite surfaces thereof, forming the first wiring layer 112a using the metal layer as a seed layer, forming the first insulating layer 111a covering the first wiring layer 112a on the metal layer, forming the second wiring layer 112b on the first insulating layer 111a, forming the second insulating layer 111b covering the second wiring layer 112b on the first insulating layer 111a, forming the third wiring layer 112c and the dummy metal layer 112D on the second insulating layer 111b to form the core member 110, separating the core member 110 from the carrier film, and then removing the metal layer remaining on the first wiring layer 112a. When the metal layer is removed, a recess portion may be formed in the core member 110. The first to third wiring layers 112a, 112b, and 112c may be formed by performing patterning using a dry film, or the like, and filling patterns by any known plating process. The first and second insulating layers 111a and 111b may be formed by any known lamination method or applying and hardening method. Meanwhile, when the second and third wiring layers 112b and 112c are formed after via holes are formed in the first and second insulating layers 111a and 111b, the first and second connection vias 113a and 113b may also be formed together with the second and third wiring layers 112b and 112c by plating.

A description of other configurations and a manufacturing method overlaps that described above, and is thus omitted. Meanwhile, the shape of the third redistribution vias 155 of the fan-out semiconductor packages 100B and 100C according to another exemplary embodiment described above may also be applied to the fan-out semiconductor package 100D according to another exemplary embodiment described above.

Figure 19:
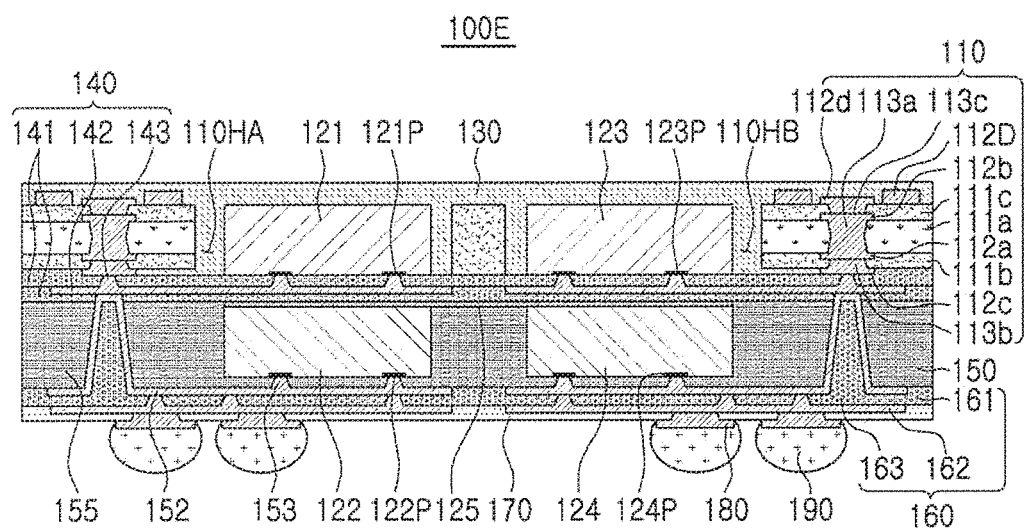
FIG. 19 is a schematic cross-sectional view illustrating another example of a fan-out semiconductor package.

FIG. 19 is a schematic cross-sectional view illustrating another example of a fan-out semiconductor package.

Referring to FIG. 19, in a fan-out semiconductor package 100E according to another exemplary embodiment in the present disclosure, a core member 110 may include a first insulating layer 111a, a first wiring layer 112a and a second wiring layer 112b disposed on a lower surface and an upper surface of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d and a dummy metal layer 112D disposed on an upper surface of the third insulating layer 111c, Since the core member 110 may include a larger number of wiring layers 112a, 112b, 112c, and 112d, a first connection member 140 may further be simplified. The first to fourth wiring layers 112a, 112b, 112c, and 112d may be electrically connected to each other through first to third connection vias 113a, 113b, and 113c each penetrating through the first to third insulating layers 111a, 111b, and 111c. The first to fourth wiring layers 112a, 112b, 112c, and 112d may be electrically connected to a first redistribution layer 142, and the dummy metal layer 112D may have a thickness greater than that of each of the first to fourth wiring layers 112a, 112b, 112c, and 112d.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d and may thus be relatively thin. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first connection via 113a may have a diameter and a height greater than those of each of the second connection via 113b and the third connection via 113c.

A thickness of each of the first to fourth wiring layers 112a, 112b, 112c, and 112d of the core member 110 may be greater than that of the first redistribution layer 142 of the first connection member 140. Since the core member 110 may have a thickness equal to or greater than that of a first semiconductor chip 121, the first to fourth wiring layers 112a, 112b, 112c, and 112d may also be formed to have large sizes. On the other hand, the first redistribution layer 142 of the first connection member 140 may be formed to have a relatively small size for thinness.

The core member 110 may be prepared by, for example, preparing a copper clad laminate (CCL) as the first insulating layer 111a, forming the first and second wiring layers 112a and 112b on opposite surfaces of the first insulating layer 111a, respectively, using copper layers of the copper clad laminate as seed layers, stacking ABFs, or the like, as the second and third insulating layers 111b and 111c on the opposite surfaces of the first insulating layer 111a, respectively, and then forming the third and fourth wiring layers 112c and 112d on the second and third insulating layers 111b and 111c, respectively, and forming the dummy metal layer 112D on the third insulating layer 111c. The first to fourth wiring layers 112a, 112b, 112c, and 112d may be formed by performing patterning using a dry film, or the like, and filling patterns by any known plating process. The second and third insulating layers 111b and 111c may be formed by any known lamination method or applying and hardening method. Meanwhile, when the first to fourth wiring layers 112a, 112b, 112c, and 112d are formed after via holes are formed in the first to third insulating layers 111a, 111b, and 111c, the first to third connection vias 113a, 113b, and 113c may also be formed by plating.

A description of other configurations and a manufacturing method overlaps that described above, and is thus omitted. Meanwhile, the shape of the third redistribution vias 155 of the fan-out semiconductor packages 100B and 100C according to another exemplary embodiment described above may also be applied to the fan-out semiconductor package 100E according to another exemplary embodiment described above.

Figure 20:
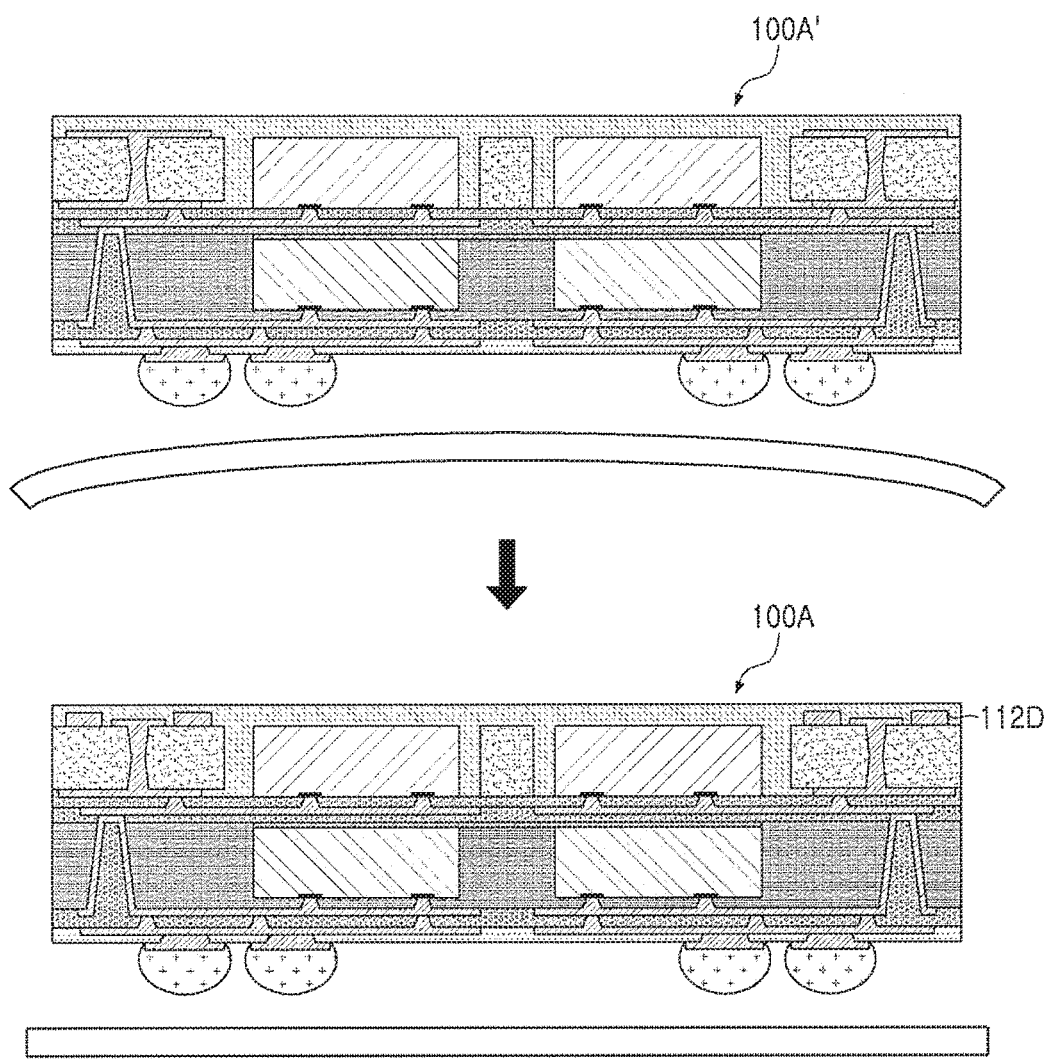
FIG. 20 is a schematic view illustrating an effect of the fan-out semiconductor package of FIG. 9.

FIG. 20 is a schematic view illustrating an effect of the fan-out semiconductor package of FIG. 9.

Referring to FIG. 20, it may be seen that warpage occurs when a core member does not include a dummy metal layer even though the core member is introduced as in a package 100A' according to Comparative Example. On the other hand, it may be seen that warpage may be more effectively suppressed when the dummy metal layer 112D is introduced in the core member as in the fan-out semiconductor package 100A according to the exemplary embodiment.

As set forth above, according to an exemplary embodiment in the present disclosure, a fan-out semiconductor package capable of being easily used in a package stack structure through a reduction in warpage may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member having a first through-hole;
a first semiconductor chip disposed in the first through-hole and having a first active surface having first connection pads disposed thereon and a first inactive surface opposing the first active surface;
a first encapsulant covering a portion of the core member and a portion of the first semiconductor chip and filling a portion of the first through-hole;
a first connection member disposed on the core member and the first active surface of the first semiconductor chip and including a first redistribution layer electrically connected to the first connection pads; and
a dummy metal layer disposed on the core member and electrically insulated from the first redistribution layer, the dummy metal layer having a thickness greater than that of the first redistribution layer;
a second semiconductor chip having a second active surface having second connection pads disposed thereon and a second inactive surface opposing the second active surface, the second inactive surface being attached to a lower surface of the first connection member;
a second encapsulant disposed on the lower surface of the first connection member and covering a portion of the second semiconductor chip;
a second redistribution layer disposed on the second encapsulant and the second active surface of the second semiconductor chip;
second redistribution vias penetrating through a portion of the second encapsulant and electrically connecting the second connection pads and the second redistribution layer to each other; and
third redistribution vias penetrating through the second encapsulant, penetrating through a portion of the first connection member and electrically connecting the first redistribution layer and the second redistribution layer to each other,
wherein the core member includes a wiring layer electrically connected to the first redistribution layer,
wherein the dummy metal layer has a thickness greater than that of the wiring layer, and
wherein each of the third redistribution vias has a height greater than that of each of the second redistribution vias.

2. The fan-out semiconductor package of claim 1, wherein the wiring layer has a thickness greater than that of the first redistribution layer.

3. The fan-out semiconductor package of claim 1, wherein the dummy metal layer is disposed at an uppermost portion of the core member.

4. The fan-out semiconductor package of claim 3, wherein the dummy metal layer includes one or more dummy pattern formed along an edge of the core member.

5. The fan-out semiconductor package of claim 4, wherein the dummy pattern is continuously formed without being disconnected, to correspond to the edge of the core member.

6. The fan-out semiconductor package of claim 5, wherein the number of dummy patterns is plural,
a wiring pattern is disposed between the plurality of dummy patterns, and
each of the plurality of dummy patterns has a thickness greater than that of the wiring pattern.

7. The fan-out semiconductor package of claim 1, wherein when the second and third redistribution vias are cut on the same level by a surface parallel with the second active surface, a length of a long side of a cut surface of the third redistribution via is greater than that of a long side of a cut surface of the second redistribution via on any level.

8. The fan-out semiconductor package of claim 1, wherein the second inactive surface of the second semiconductor chip is attached to the lower surface of the first connection member through a die attach film (DAF).

9. The fan-out semiconductor package of claim 1, further comprising a third semiconductor chip having a third active surface having third connection pads disposed thereon and a third inactive surface opposing the third active surface,
  wherein the core member further has a second through-hole spaced apart from the first through-hole,
  the third semiconductor chip is disposed in the second through-hole side by side with the first semiconductor chip,
  the first encapsulant covers at least a portion of the third semiconductor chip and fills at least a portion of the second through-hole, and
  the first, connection member is also disposed on the third active surface of the third semiconductor chip, and the first redistribution layer is also electrically connected to the third connection pads.

10. The fan-out semiconductor package of claim 9, further comprising a fourth semiconductor chip having a fourth active surface having fourth connection pads disposed thereon and a fourth inactive surface opposing the fourth active surface,
  wherein the fourth semiconductor chip is disposed side by side with the second semiconductor chip so that the fourth inactive surface is attached to the lower surface of the first connection member,
  the second encapsulant covers at least a portion of the fourth semiconductor chip,
  the second redistribution layer is also disposed on the fourth active surface of the fourth semiconductor chip, and
  the second redistribution vias also electrically connect the fourth connection pads and the second redistribution layer to each other.

11. The fan-out semiconductor package of claim 1, further comprising:
  a second connection member disposed on the second encapsulant and the second redistribution layer and including a third redistribution layer electrically connected to the second redistribution layer;
  a passivation layer disposed on the second connection member and having openings exposing at least a portion of the third redistribution layer;
  underbump metal layers disposed in the openings of the passivation layer and connected to at least a portion of the exposed third redistribution layer; and
  electrical connection structures disposed on the passivation layer and connected to the underbump metal layers.

12. The fan-out semiconductor package of claim 1, wherein the core member includes a first insulating layer, a first wiring layer disposed on a lower surface of the first insulating layer, a second wiring layer disposed on an upper surface of the first insulating layer, and first connection vias penetrating through the first insulating layer and electrically connecting the first and second wiring layers to each other,
  the first and second wiring layers are electrically connected to the first redistribution layer, and the dummy metal layer has a thickness greater than that of each of the first and second wiring layers.

13. The fan-out semiconductor package of claim 12, wherein the core member further includes a second insulating layer disposed on the lower surface of the first insulating layer and covering the first wiring layer, a third wiring layer disposed on a lower surface of the second insulating layer, second connection vias penetrating through the second insulating layer and electrically connecting the first and third wiring layers to each other, a third insulating layer disposed on the upper surface of the first insulating layer and covering the second wiring layer, a fourth wiring layer disposed on an upper surface of the third insulating layer, and third connection vias penetrating through the third insulating layer and electrically connecting the second and fourth wiring layers to each other,
  the third and fourth wiring layers are electrically connected to the first redistribution layer, and
  the dummy metal layer has a thickness greater than that of each of the third and fourth wiring layers.

14. The fan-out semiconductor package of claim 1, wherein the core member includes a first insulating layer, a first wiring layer in contact with the first connection member and embedded in the first insulating layer, a second wiring layer disposed on the other surface of the first insulating layer opposing one surface of the first insulating layer in which the first wiring layer is embedded, first connection vias penetrating through the first insulating layer and electrically connecting the first and second wiring layers to each other, a second insulating layer disposed on the first insulating layer and covering the second wiring layer, a third wiring layer disposed on the second insulating layer, and second connection vias penetrating through the second insulating layer and electrically connecting the second and third wiring layers,
  the first to third wiring layers are electrically connected to the first redistribution layer, and
  the dummy metal layer has a thickness greater than that of each of the first to third wiring layers.

15. A fan-out semiconductor package comprising:
  a core member having a first through-hole and including a dummy metal layer disposed at an uppermost portion thereof;
  a first semiconductor chip disposed in the first through-hole and having a first active surface having first connection pads disposed thereon and a first inactive surface opposing the first active surface;
  a first encapsulant covering at least a portion of the core member and at least a portion of the first semiconductor chip and filling at least a portion of the first through-hole;
  a first connection member disposed on the core member and the first active surface of the first semiconductor chip and including a first redistribution layer electrically connected to the first connection pads;
  a second semiconductor chip having a second active surface having second connection pads disposed thereon and a second inactive surface opposing the second active surface, the second inactive surface being attached to a lower surface of the first connection member;
  a second encapsulant disposed on the lower surface of the first connection member and covering a portion of the second semiconductor chip;
  a second redistribution layer disposed on the second encapsulant and the second active surface of the second semiconductor chip;
  second redistribution vias penetrating through a portion of the second encapsulant and electrically connecting the second connection pads and the second redistribution layer to each other; and
  third redistribution vias penetrating through the second encapsulant and electrically connecting the first redistribution layer and the second redistribution layer to each other.

16. A fan-out semiconductor package comprising:
- a first connection member having a first surface and a second surface opposing the first surface, the first connection member including a first redistribution layer;
- a core member having a through-hole disposed on the first surface of the first connection member;
- a first semiconductor chip having a first active surface with first connection pads disposed thereon disposed in the through-hole and on the first surface such that the first connection pads are electrically connected to the first redistribution layer; and
- a dummy metal layer disposed on the core member and electrically insulated from the first redistribution layer, the dummy metal layer having a thickness greater than that of the first redistribution layer;
- a second semiconductor chip having a second active surface with second connection pads disposed thereon and a second inactive surface opposing the second active surface disposed on the second surface of the connection member such that the second inactive surface is adjacent the second surface of the connection member;
- a first encapsulant covering a portion of the core member and a portion of the first semiconductor chip and filling a portion of the through-hole;
- a second encapsulant disposed on the second surface of the connection member and covering a portion of the second semiconductor chip;
- a second redistribution layer disposed on the second encapsulant and the second active surface;
- second redistribution vias penetrating through a portion of the second encapsulant and electrically connecting the second connection pads to the second redistribution layer; and
- third redistribution vias penetrating through the second encapsulant and a portion of the first connection member, and electrically connecting the first redistribution layer to the second redistribution layer,
- wherein the core member includes a wiring layer electrically connected to the first redistribution layer, and
- wherein the dummy metal layer has a thickness greater than that of the wiring layer.

* * * * *